(12) United States Patent
Honma et al.

(10) Patent No.: US 7,265,035 B2
(45) Date of Patent: Sep. 4, 2007

(54) SEMICONDUCTOR DEVICE AND ITS MANUFACTURING METHOD

(75) Inventors: Hiroshi Honma, Yokohama (JP); Noriyuki Ooroku, Yokohama (JP); Hitoshi Odashima, Yokohama (JP); Toru Mita, Yamato (JP); Chuichi Miyazaki, Akishima (JP); Takashi Wada, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 169 days.

(21) Appl. No.: 10/503,972

(22) PCT Filed: Mar. 10, 2003
(Under 37 CFR 1.47)

(86) PCT No.: PCT/JP03/02799

§ 371 (c)(1),
(2), (4) Date: May 6, 2005

(87) PCT Pub. No.: WO03/077310

PCT Pub. Date: Sep. 18, 2003

(65) Prior Publication Data
US 2006/0252233 A1   Nov. 9, 2006

(30) Foreign Application Priority Data
Mar. 11, 2002   (JP)   ............................. 2002-065428
Dec. 3, 2002   (JP)   ............................. 2002-350631

(51) Int. Cl.
*H01L 21/00*   (2006.01)

(52) U.S. Cl. ............................. 438/464; 257/E21.484
(58) Field of Classification Search ................ 438/120, 438/460, 464, 110, 113
See application file for complete search history.

(56) References Cited

U.S. PATENT DOCUMENTS 6,585,471 B2 *   7/2003   Odajima et al. ............ 414/403

FOREIGN PATENT DOCUMENTS

| JP | 01-157549 | 6/1989 |
|----|-----------|--------|
| JP | 02-230754 | 9/1990 |
| JP | 3-011649 | 1/1991 |
| JP | 4-177860 | 6/1992 |
| JP | 5-003242 | 1/1993 |
| JP | 5-109869 | 4/1993 |
| JP | 6-295930 | 10/1994 |
| JP | 7-106363 | 4/1995 |
| JP | 2000-091403 | 3/2000 |

* cited by examiner

*Primary Examiner*—Scott B. Geyer
*Assistant Examiner*—Elias Ullah
(74) *Attorney, Agent, or Firm*—Antonelli, Terry, Stout & Kraus, LLP.

(57) ABSTRACT

To improve the reliability and yield of a thin-type semiconductor device as used for a stack-type flash memory, the semiconductor device is manufactured by upheaving each of semiconductor chips (semiconductor devices) obtained by dicing a semiconductor wafer on an adhesive sheet from a backside via the adhesive sheet using an upthrow jig to which ultrasonic vibration is applied so as not to break through the adhesive sheet, and by picking up each semiconductor chip.

10 Claims, 25 Drawing Sheets

(a)  W1>W2

(b)  W3>W4

(a)

(b)

FIG. 8
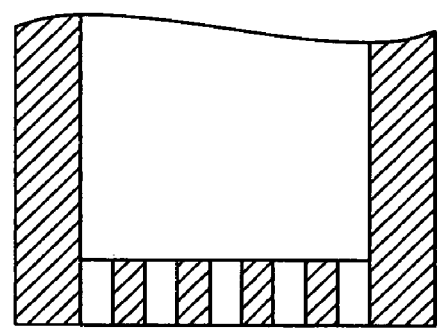
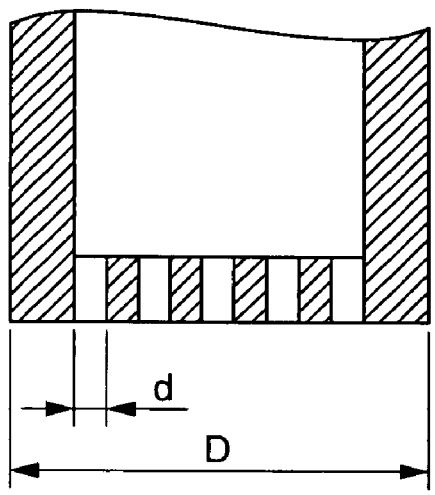
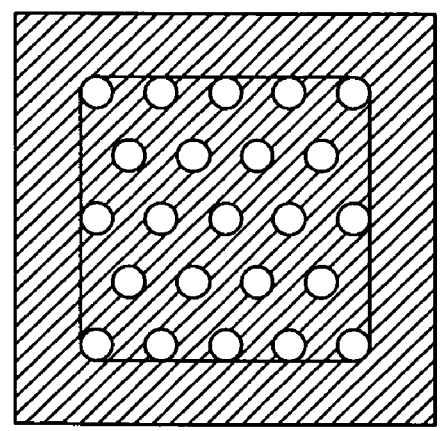
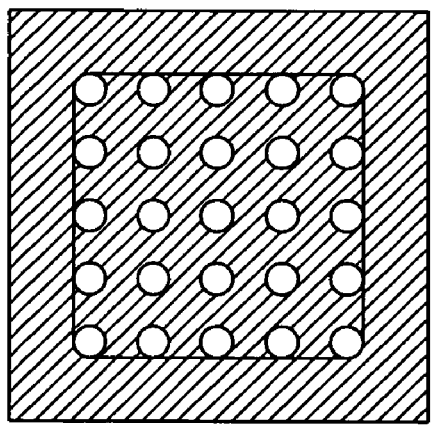
(a)                                              (b)

FIG. 16
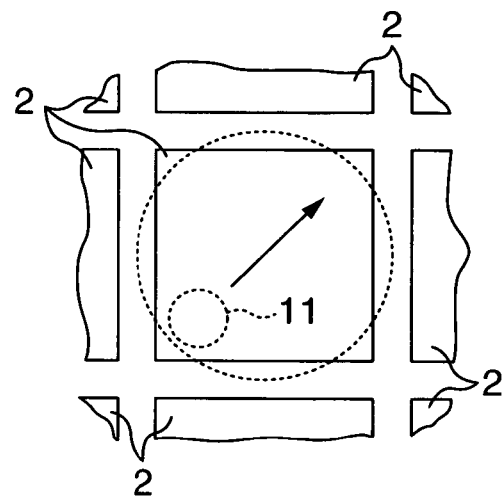
(a)
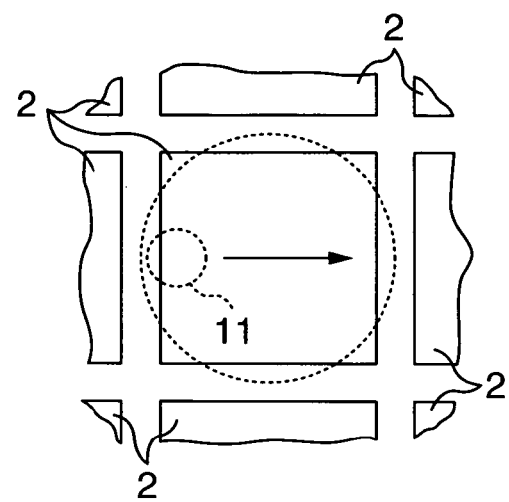
(b)
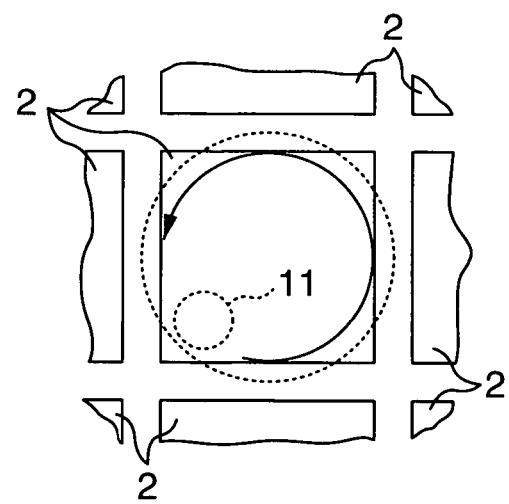
(c)

FIG. 21
(a)
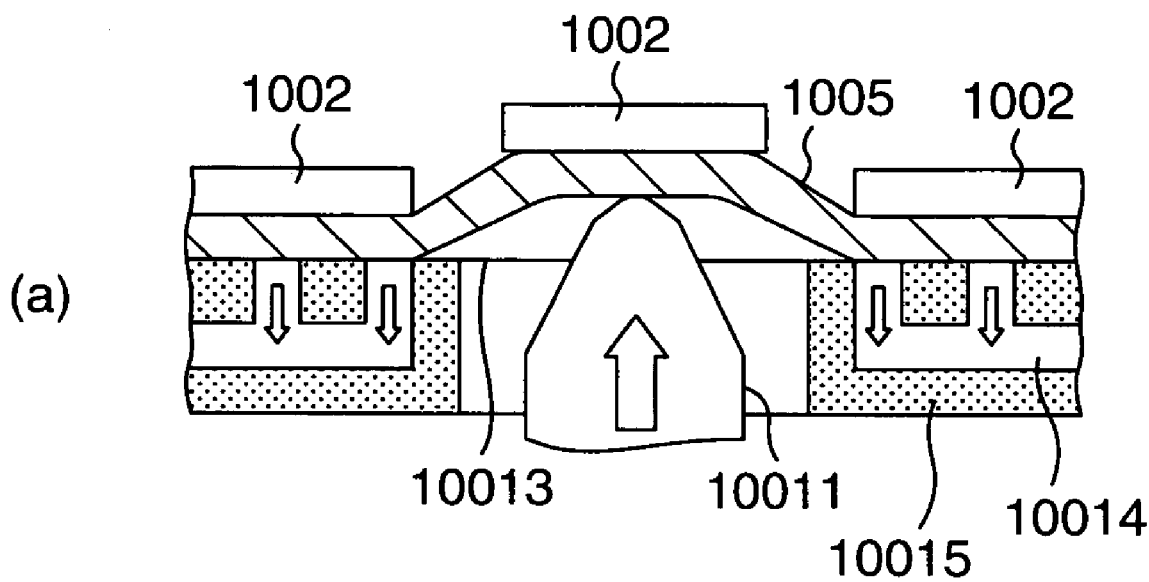
(b)
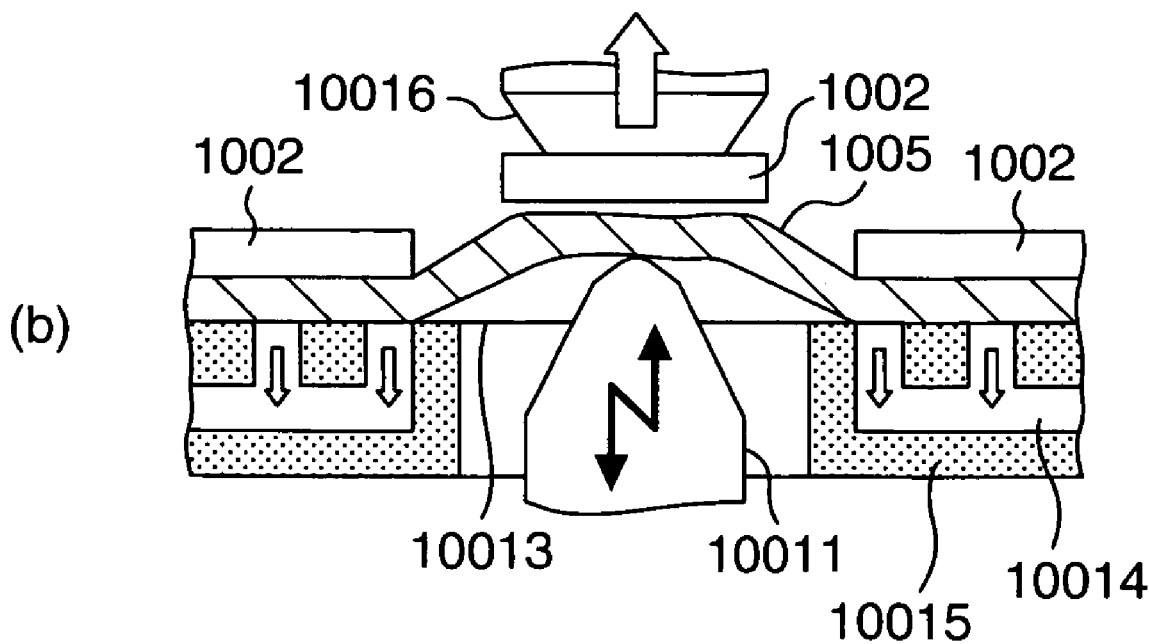

FIG. 24
(a)
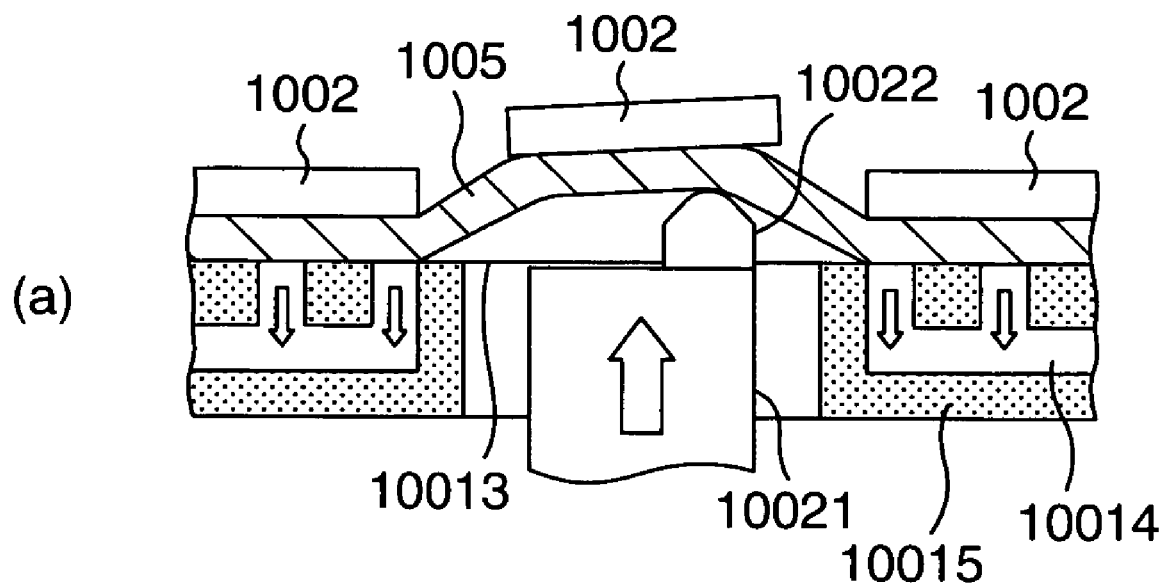
(b)
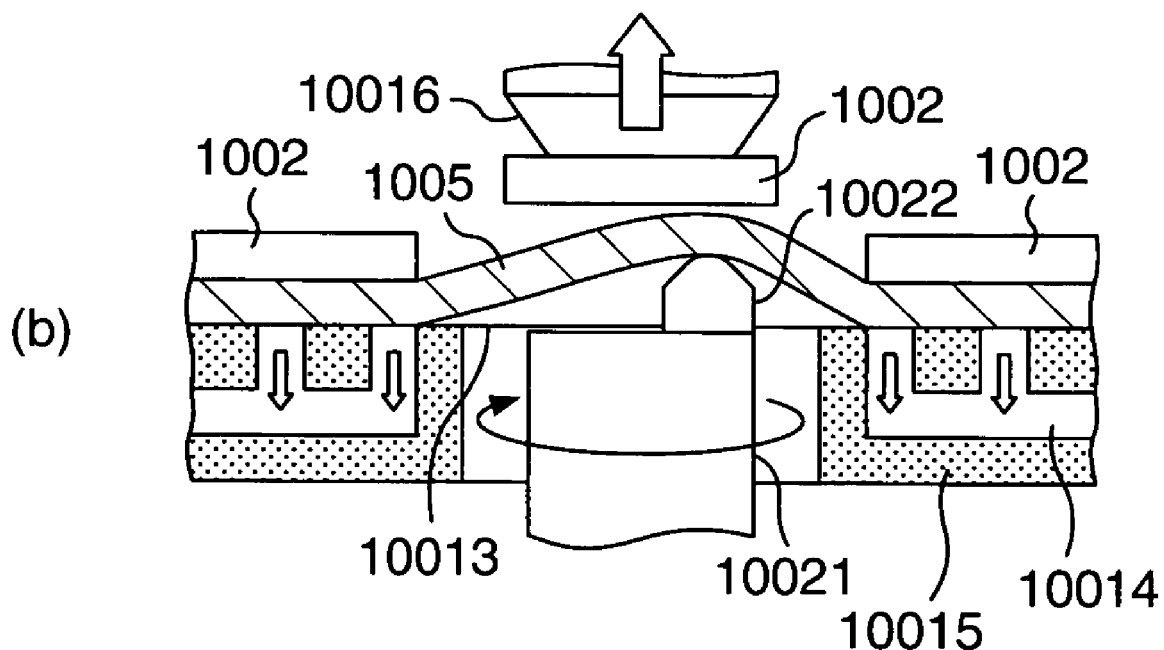

FIG. 26
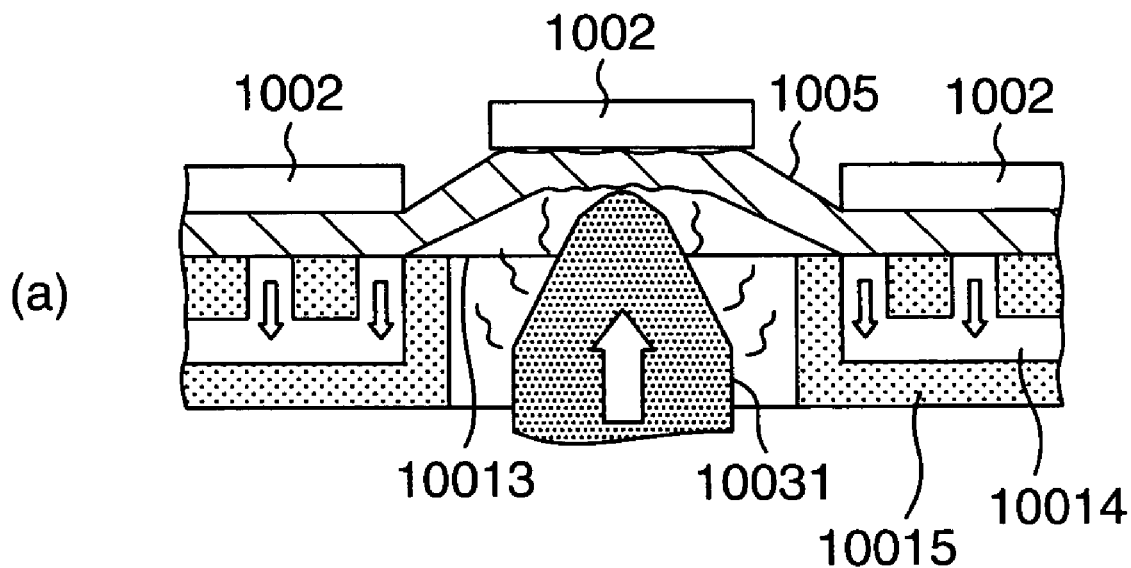
(a)
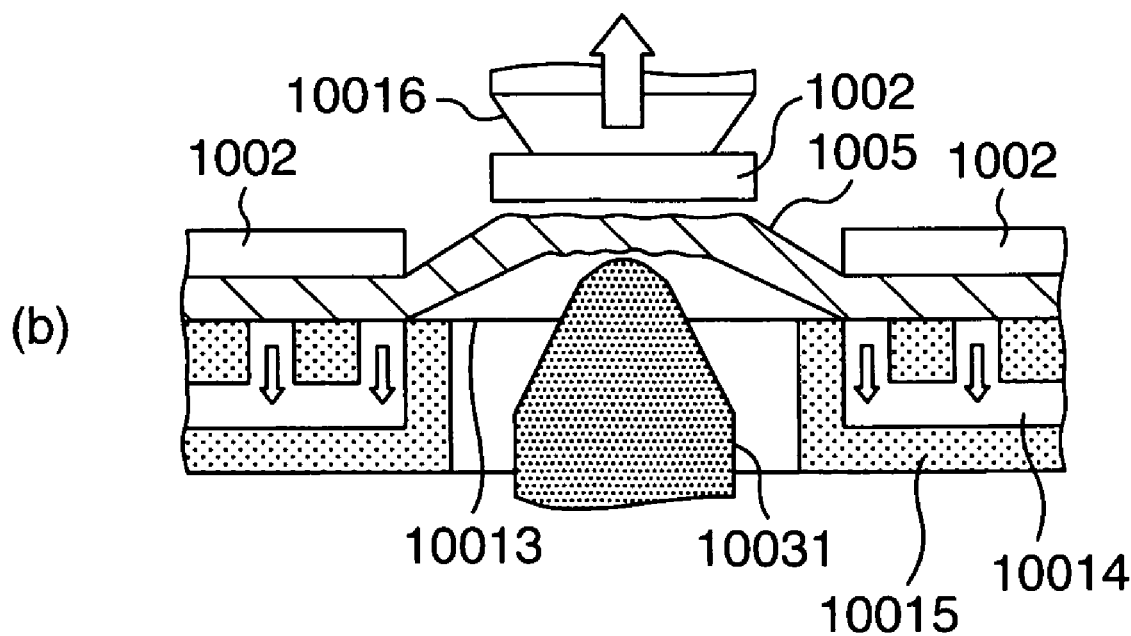
(b)

FIG. 29
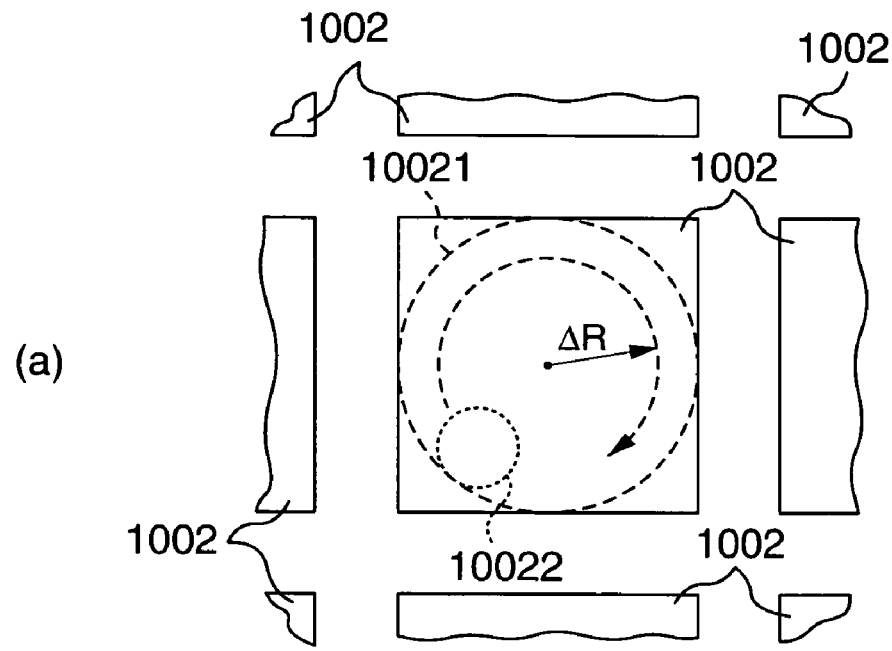
(a)
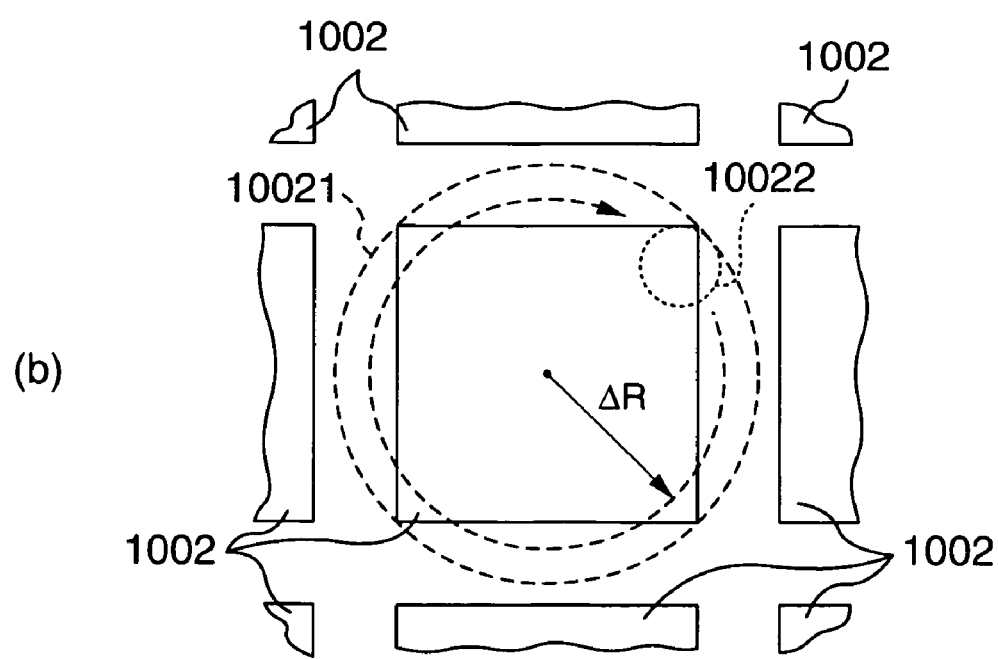
(b)

SEMICONDUCTOR DEVICE AND ITS MANUFACTURING METHOD

BACKGROUND OF THE INVENTION

The present invention relates to semiconductor device manufacturing technology.

A semiconductor device manufacturing process includes a first step of simultaneously forming a plurality of semiconductor chips on a semiconductor wafer, a second step of attaching an adhesive sheet to the semiconductor wafer, a third step of dicing (cutting) the wafer and a part of the adhesive sheet so that the dies (the semiconductor chips) are not separated, and a fourth step of removing and picking up the cut-diced semiconductor chips from the adhesive sheet.

As a prior art in the fourth step, there are known JP-A-02-230754 (prior arts 1 and 2), JP-A-05-109869 (prior art 3), JP-A-06-295930 (prior art 4), and JP-A-07-106363 (prior art 5).

Prior art 1 discloses a technique in which a needle pin is inserted from a backside of an adhesive sheet to be removed, so as to break through the adhesive sheet by the inserting force and further, the pin directly upheaves a semiconductor chip to remove it from the adhesive sheet. In prior art 1, large removal force is generated by directly upheaving the semiconductor chip. Therefore, prior art 1 is regarded as a technique capable of performing the above operation more quickly and securely than ever before.

Prior art 2 discloses a technique in which a semiconductor chip is removed from an adhesive sheet by adding ultrasonic vibration to the adhesive sheet while upheaving it using a rod pin to weaken the adhesive force between the semiconductor chip and the adhesive sheet. This technique makes it possible to decrease the removal time by adding ultrasonic vibration.

Prior art 3 discloses a technique similar to that of prior art 1, in which a semiconductor chip to be removed is directly upheaved using an upthrow needle by breaking through an adhesive tape. However, prior art 3 is different from prior art 1 in the respect that the removal (peeling) of the semiconductor chip is made easy by using a plurality of upthrow needles and adding vibration.

Prior art 4 discloses that the adhesive force between a semiconductor chip and an adhesive sheet is weakened by setting a removal head under the adhesive sheet, which removal head comprises a bounding pin and a plurality of upthrow pins arranged around the bounding pin, to rub a backside of the adhesive sheet, two or three times, from the outside using the bounding pin via a mechanism such as a cam. Also, prior art 4 discloses that after weaken the adhesive force, the semiconductor chip is uniformly lifted by raising the plurality of upthrow pins set around the bounding pin together with the bounding pin to remove the adhesive sheet which has been weakened in adhesive force.

Prior art 5 discloses that after applying a dicing tape to the bottom by means of an upthrow rod and covering a die (semiconductor chip) with a collet, the dicing tape and the collet are vibrated by a vibrator in parallel with each other to remove an adhesive tape from the semiconductor chip. The die is vacuumed into the collet and mounted on an island of a lead frame.

BRIEF SUMMARY OF THE INVENTION

Above prior art 1 has been frequently used so far in order to quickly and securely perform the removal (peeling). However, in the case of prior art 1, the adhesive sheet is broken through by the needle pin to directly upheave the semiconductor chip and therefore, a fine scratch is easily produced on a nonfunctional surface (an opposite surface of a terminal surface) of the semiconductor chip in contact with the adhesive sheet due to an impression of the needle-shaped upthrow pin.

In recent years, a memory module is increased in capacity and a system LSI is improved in performance, so that a semiconductor chip is decreased in thickness and size. Particularly in the case of a mobile terminal such as a cellular phone, a stack-type flash memory is frequently used, in which many large-capacity storage devices are stacked and moreover, a central processing unit is stacked.

In the case of the semiconductor chip as applied to the above stack-type semiconductor device, it is necessary to set the thickness of the semiconductor chip to 100 µm or less in order to decrease the thickness of the semiconductor device.

However, in the case of applying prior art 1 to manufacturing of a semiconductor device on which the thin semiconductor chip of 100 µm or less is mounted, remarkable troubles are occurred because of the following reasons.

According to experiments by the inventors, when performing removal (peeling) using prior art 1 under mass production condition, a scratch on a backside of a semiconductor chip may reach 30 µm in depth. The scratch of this degree does not matter in the case of a conventional semiconductor chip having a thickness of 200 µm or more because the thickness of an insulating layer up to a functional surface on which a terminal is formed is large. However, in the case of a thin semiconductor chip of 100 µm or less as used for a stack-type flash memory, the scratch affects a place very close to the functional surface. When mounting the semiconductor chip on a substrate or lead frame, a predetermined strength of the semiconductor chip cannot be secured or the semiconductor chip is cracked due to the scratch.

Accordingly, it is necessary to improve the reliability of a stack-type semiconductor device.

Also, the same problem occurs depending on the structure or purpose of the semiconductor device (semiconductor package).

Firstly, the depth of a scratch on a backside of a semiconductor chip allowable in view of strength according to a package structure and a semiconductor chip thickness is described below.

In the case of flip chip mounting (FC), a semiconductor chip is directly mounted on user's circuit board. Therefore, the semiconductor chip is exposed and thus easily receives an external force. If there is a damage such as an impression or scratch of a depth which cannot be ignored in connection with the thickness of the semiconductor chip, the mechanical strength of the semiconductor chip is extremely deteriorated due to the external force. Particularly in a process from manufacturing to shipment or a process before mounting on user's circuit board, the external force (pressure or impact) is applied. Moreover, even when an end product is completed, destruction is caused due to change in working temperature, and the deflection or the external force due to impact.

Also, a structure using chip-on-board mounting (COB) is molded and covered with a resin so as to cover the whole semiconductor chip after mounting the semiconductor chip on user's circuit board. In this case, even if the mechanical strength is deteriorated due to presence of an impression or scratch on the semiconductor chip, the semiconductor chip mounted on the circuit board is protected by the resin mold and thereby, the probability of breakage is small after the chip becomes an end product. However, in the process from the manufacturing to the shipment of the semiconductor chip and in the process before the chip is mounted on user's circuit board, the semiconductor chip is not protected and therefore, the probability of breakage is not reduced. The probability of breakage at the manufacturing stage can be reduced by reducing impact when transferring the chip to a tray, by relaxing impact when carrying the chip by improving a packaging material, and by process control in the circuit mounting process because the process control is easy in comparison with the case of the end product. However, there increase administrative restrictions and thus make the handling difficult.

Further, in the case of a semiconductor device packaged by a mold, a semiconductor chip is already covered with a mold material such as a resin when the semiconductor device is shipped from a semiconductor maker. Therefore, a scratch is hard to matter even in the case of a thin semiconductor chip. Furthermore, because the manufacturing process is consistently under control by a semiconductor maker, it is easy to make severe process control. Therefore, the semiconductor device packaged by the mold can use a thin semiconductor chip even if having a scratch of the same degree.

However, also in this case, the semiconductor chip may be broken by a scratch in the process before packaging the semiconductor chip, by necessity. Therefore, a technique for reducing the scratches is necessary.

Moreover, the restriction of the thickness of the semiconductor chip usable in a prior art varies also in accordance with the use condition of the end product, in addition to these mounting embodiments. For example, in the case of a toy, the temperature and humidity ranges guaranteeing its performance, the shock resistant performance, and the guaranteed service life are slight, and a requirement for strength and reliability is not severe, in comparison with the case of the semiconductor used in typical industrial applications. Therefore, a problem may not occur even if using the toy in a slight protecting state in comparison with the case of the industrial semiconductor chip. As with the case with the above, in the case of an electronic information unit attaching importance to small size and weight such as a cellular phone and a mobile unit, a requirement for reliability may be reduced for the weight reduction purpose. However, a defect due to the above scratch becomes an issue if each product exceeds a certain limit although there is a difference between degrees.

FIG. 17 shows limit values of the applicable thicknesses of the semiconductor chips corresponding to various mounting conditions and applications in the case that the semiconductor chip is fabricated in a process in which an impression and scratch may occur on the backside of the semiconductor chip due to the above prior art.

As already described, in the case of FC, it is necessary to use a thick semiconductor chip because the semiconductor chip is only slightly protected. In the case of the mold type, breakage or trouble does not easily occur even if using a thin semiconductor chip because of the protective effect by the mold. However, when using conventional removal technique, an impression or scratch due to the impression may occur on a backside of a semiconductor chip. Therefore, it is generally difficult to use a thin semiconductor chip of 100 µm or less. Even if severely managing the manufacturing process and improving a mounting structure, the conventional removal technique is difficult to make great improvement to satisfy the illustrated applicable limits.

In the case of prior art 3, a functional surface of a semiconductor chip is easily scratched since a needle upthrow pin is used for the removal, as with the case with prior art 1. Moreover, because vibration is applied, generation of an impression on a backside of the semiconductor chip is also progressed. Even if no trouble occurs in the case of a general-purpose semiconductor chip having a thickness of approx. 200 µm, when using a thin semiconductor chip of 100 µm or less, the probability of causing a critical trouble with respect to strength reduction is large.

Prior art 2 discloses that the adhesive sheet on the backside of the semiconductor chip is removed by pressing it against a vibrator having a flat tip end.

However, the thickness of the semiconductor chip to be removed in prior art 2 is 575 µm. In the case of the semiconductor chip having the above thickness, the influence of the above scratch is small. Therefore, prior art 1 having a high removal speed has been applied thereto so far.

That is, a problem to be solved by the technique of prior art 2 is not known as to whether a remarkable effect can be obtained in a semiconductor chip having any thickness or not. Therefore, prior art 2 has not been applied in the semiconductor industry.

Although there are many other removal techniques, it has been said that a method of breaking through an adhesive sheet by a tip end of a needle upthrow pin is the most preferable conformation for practical use such as prior art 1 and prior art 3, in the semiconductor industry.

In other words, it has not been studied what removal method is suited to remove an adhesive sheet attached to a semiconductor chip having a thickness of 100 µm or less made by back-grinding, as used for a stack-type semiconductor device.

It is an object of the present invention to provide a semiconductor device manufacturing method for quickly removing an adhesive sheet attached to a semiconductor chip having a thickness of 100 µm or less without scratching the semiconductor chip.

Moreover, it is another object of the present invention to provide a semiconductor device manufacturing method for quickly removing an adhesive sheet attached to a semiconductor chip used for a stack-type semiconductor device without scratching the semiconductor chip.

The present application includes a plurality of inventions capable of solving the above problems.

Typical ones of the inventions are described below.

One of the inventions is a semiconductor device manufacturing method for manufacturing a semiconductor device by dicing a semiconductor wafer to which an adhesive sheet is attached into individual semiconductor chips, vacuuming and holding each semiconductor chip by a vacuuming jig, collecting the semiconductor chips from the adhesive sheet to use the semiconductor chips, wherein when removing the adhesive sheet from a semiconductor chip having a thickness of 100 µm or less, ultrasonic vibration is applied to the semiconductor chip via the adhesive sheet.

Because the ultrasonic vibration is used, it is possible to remove the semiconductor chips from the adhesive sheet without breaking through the adhesive sheet. Accordingly, because it can be possible to use a semiconductor chip hardly damaged in the region of a functional surface, it is possible to provide a semiconductor device having high reliability.

Moreover, there is a stack-type semiconductor device on which a semiconductor chip is vertically mounted, which uses the semiconductor chip removed, by means of ultrasonic vibration, from an adhesive sheet attached to the semiconductor chip subjected to a back-grinding step and a dicing step.

Further, a semiconductor chip applied to a stack-type semiconductor device has a very small thickness of 100 μm or less. Therefore, if applying a semiconductor chip manufactured by a conventional method, a crack occurs when actually mounting it and thus, the reliability is low. However, if using a semiconductor chip manufactured by removal using an ultrasonic wave, it is possible to provide a semiconductor device having high reliability because the number of cracks is very small.

Other objects, features, and advantages of the present invention will become more apparent from the description of the embodiments of the present invention relating to the accompanying drawings.

BRIEF DESCRIPTION OF THE SEVERAL VIEWS OF THE DRAWINGS

FIG. 8 shows sectional views illustrating an example of the arrangement of vacuuming holes of the vacuuming collet;

FIG. 16 shows views illustrating an example of an upthrow-jig moving track;

FIG. 21 shows sectional views illustrating an upthrow operation of a chip separating unit;

FIG. 24 shows sectional views illustrating an example of an upthrow operation in order of steps;

FIG. 26 shows sectional views illustrating an example of an upthrow operation in order of steps;

FIG. 29 shows top views illustrating an example of actions of a chip separating unit.

DETAILED DESCRIPTION OF THE INVENTION

Embodiments of the present invention will be described in detail below by referring to the accompanying drawings.

FIGS. 1(a) to 1(e) are sectional views showing an example of a wafer back grinding step and a dicing step in a semiconductor device fabrication method, in the order of the steps, in which a semiconductor wafer is processed to be thin, and cut into semiconductor device units.

Figure 1:
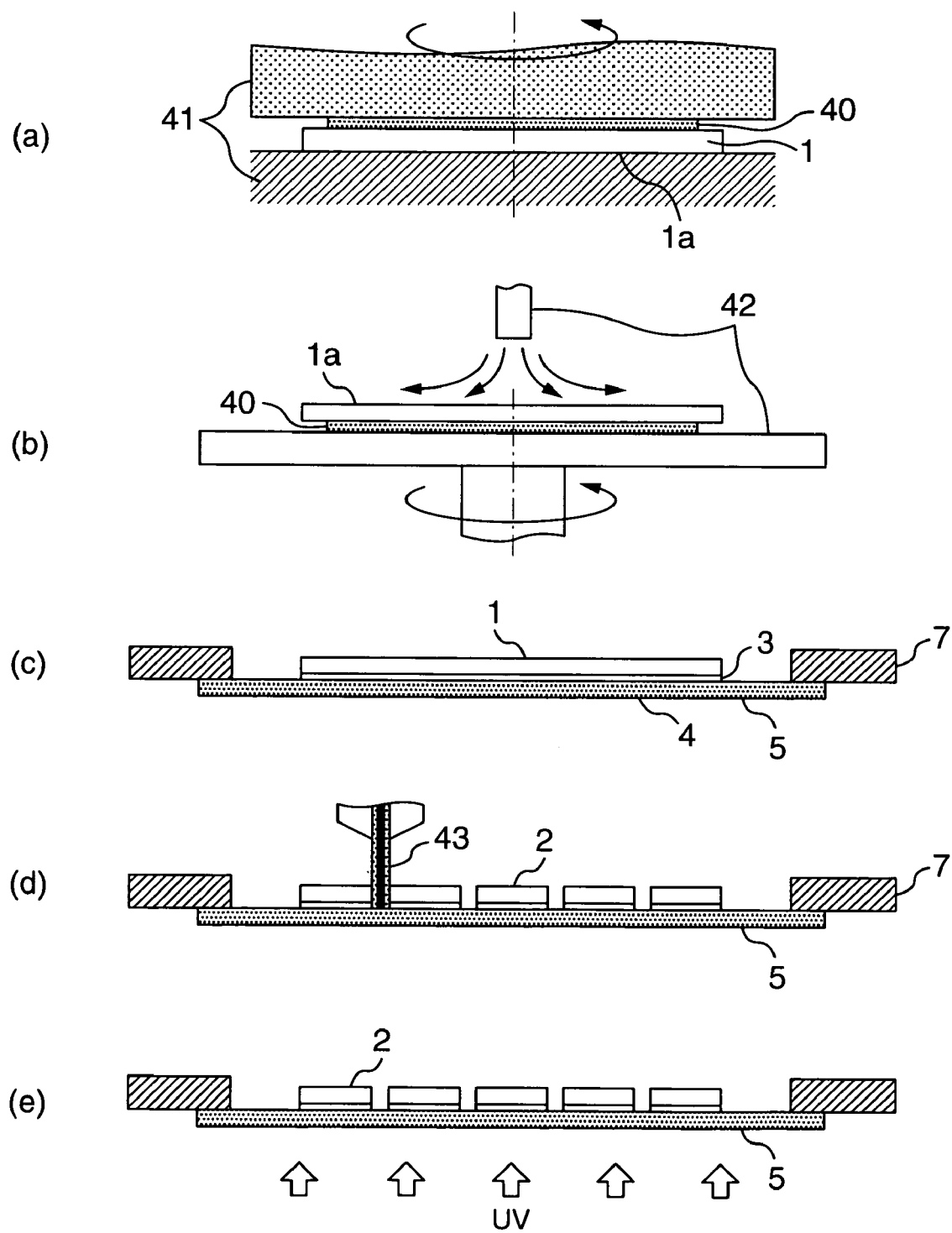
FIG. 1 shows sectional views illustrating a semiconductor wafer backside grinding step and a dicing step in order of steps.

A semiconductor device fabrication flow of the present invention is described below by referring to FIG. 1.

At present, silicon is most frequently used as a semiconductor material. A silicon wafer is formed by grinding, slicing and polishing the outer periphery of ingot-shaped single-crystalline silicon.

Then, a plurality of semiconductor circuits of chip units are simultaneously formed on a semiconductor wafer in accordance with the normal semiconductor fabrication method of a wafer process such as the photolithography technique.

A semiconductor wafer 1 in which semiconductor circuits are formed is decreased in thickness into a predetermined thickness of approx. 200 μm by attaching an adhesive tape 40 for grinding to the circuit face side and grinding the wafer back 1a by a grinder 41 (FIG. 1(a)) to obtain a predetermined thickness of the wafer. The wafer back 1a whose surface becomes rough and warped due to grinding is finished into a predetermined thickness of 100 μm or less by a chemical etching apparatus 42 or polishing apparatus (FIG. 1(b)). Then, non-defective product sorting is performed through a functional test of each semiconductor device by a wafer probe at a wafer level (for example, by putting a mark on a defective semiconductor chip and thereby making external sorting possible).

The semiconductor wafer 1 decreased in thickness is attached to an adhesive sheet 5 for dicing so that a semiconductor circuit pattern is turned upward.

The adhesive sheet 5 is formed by an elastic resin sheet base material 4 such as PVC (polyvinyl chloride) or PET (polyethylene terephthalate) and an adhesive agent layer 3 at one side of the sheet base material. The adhesive agent layer 3 includes a layer which is cured through irradiation with ultraviolet radiation (UV) and its adhesive strength is deteriorated. The adhesive sheet 5 to which a semiconductor wafer is attached is fixed by extending and bonding it to a frame 7 so that its outer periphery is not loosened (FIG. 1(c)).

The semiconductor wafer 1 attached to the adhesive sheet 5 fixed to the frame 7 is longitudinally and transversely diced along a cut margin (scribing line) of approx. 100 μm at peripheral four sides of a semiconductor device 2 (semiconductor chip) by using a very thin circular blade to which fine diamond particles are attached, as referred to as a dicing saw 43, to cut the semiconductor wafer 1 into semiconductor chip units in a dicing step (FIG. 1(d)).

UV is applied from the back of the adhesive sheet 5 of the cut semiconductor chips 2 to cure the adhesive agent layer 3 of the adhesive sheet 5 and reduce its adhesive strength so that the semiconductor chips 2 can be easily separated from the adhesive sheet 5 (FIG. 1(e)).

Then, an external inspection is performed by a microscope and, cracks and scratches are checked to remove or mark defective chips.

After the dicing step, semiconductor chips are separated like each embodiment of the present invention shown below to selectively pick up only a non-defective semiconductor device (semiconductor chip 2) free from a defective mark. Then, the picked-up semiconductor device is bonded to a substrate on which the semiconductor device is to be mounted, such as a lead frame, by a bonding device. To join the device with the substrate on which the device is to be mounted, there is a method for previously applying an adhesive resin such as silver paste to the substrate on which the device is to be mounted before bonding to slightly press a chip onto the substrate, or a method for joining a chip on which a backside a gold thin film is formed with a silver-plated substrate on which a device is to be mounted by making eutectic crystal of gold and silicon at a high temperature.

Then, wire bonding is performed, in which an external electrode pad of the semiconductor chip and a mounted substrate-side lead electrode are connected each other by a gold wire. As other methods, there are thermal solder reflow in which a solder bump or gold bump is previously formed on an external electrode pad of a chip to align the bump with a lead electrode, flip-chip bonding in which joining is performed by applying ultrasonic vibration in a pressurized state, and a TAB method in which a bump is formed on an external electrode pad of a chip or a tape film and pressurized and heated to perform joining.

Moreover, a semiconductor chip, gold wire, and their joined portions are resin-sealed in order to electrically and mechanically protect them from an external environment.

Furthermore, in the case of a lead frame, the tip end of a lead is cut and then, the lead is curved by a roller to mold the lead frame so that the lead frame is finished.

Furthermore, non-defective semiconductor devices are shipped after passing through a non-defective product sorting step (aging etc.) before shipment.

In addition to the above mounting methods, after the dicing step, there is a case in which a chip to be shipped is mounted on a chip mounting vessel (tray) in which recesses larger than the chip shape are arranged at a grid or a film having a small adhesive strength by a chip separating unit and a bonding unit having a pickup of each embodiment of the present invention shown below and shipped.

Figure 2:
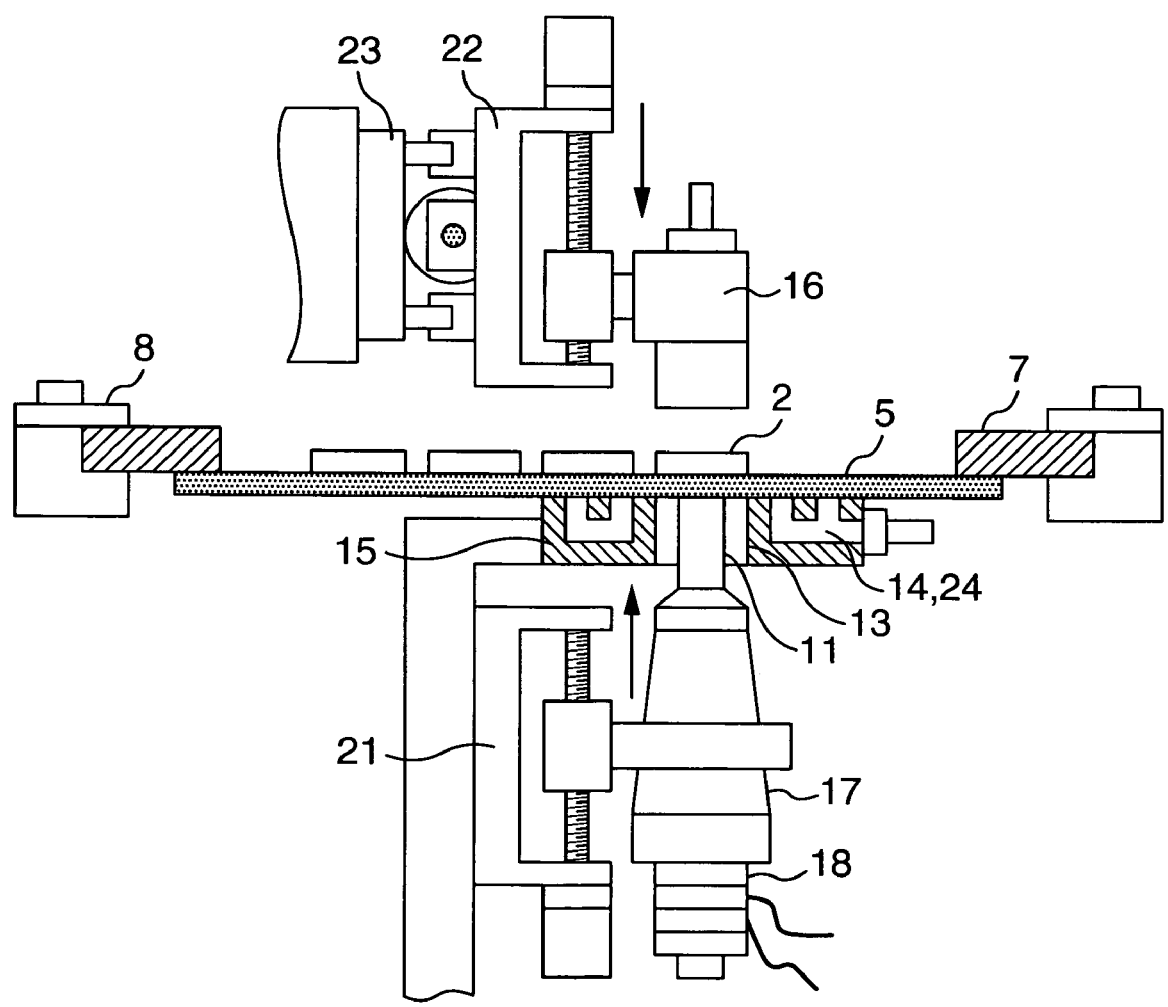
FIG. 2 is a sectional view showing an example of a configuration of a chip separating unit.

FIG. 2 is a sectional view showing an example of the configuration of a chip separating unit used for a fabrication method of a semiconductor device which is this embodiment 1.

FIGS. 3(a) and 3(b) are sectional views showing an example of the upthrow operation of the chip separating unit of this embodiment 1 in order of the steps.

Figure 4:
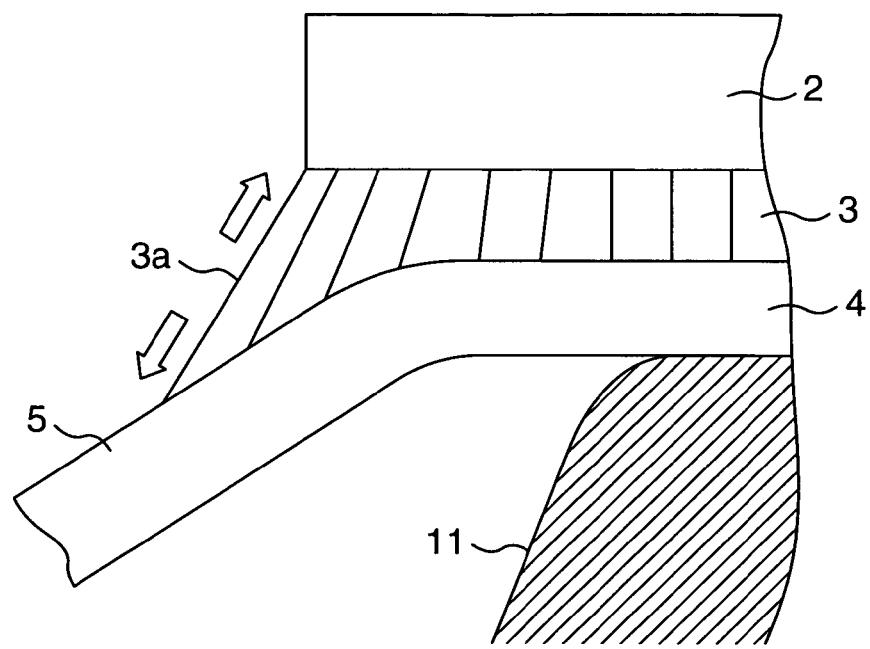
FIG. 4 is an enlarged sectional view showing a state of an adhesive layer at the time of upthrowing in the chip separating unit.

FIG. 4 is an enlarged sectional view showing an example of a state of an adhesive agent layer at the time of upthrowing by the chip separating unit of this embodiment 1.

The chip separating unit of this embodiment 1 has a pickup stage 8 for supporting the adhesive sheet 5 to which the semiconductor chip 2 having been subjected to a dicing step is attached and the frame 7 to perform horizontal movement and positioning operation, a vacuuming stage 15 located under the pickup stage 8 to vacuum the back of the adhesive sheet 5, an upthrow jig 11 which is a jig for upthrowing the adhesive sheet 5 and semiconductor chip 2 and which is vertically movably set to an upthrow hole 13 at the center of the vacuuming stage, an ultrasonic vibrator 17 having a built-in piezoelectric device 18 arranged under the upthrow jig 11, and a vacuuming collet 16 which is a member for generating supersonic vibration in the upthrow jig 11 and for vacuuming and holding the separated semiconductor chip 2 and mounting the chip 2 on a substrate and which is set above the pickup stage 8.

As shown in FIG. 3(a), the semiconductor chip 2 to be separated is upheaved by the tip end of the upthrow jig 11 through the adhesive sheet 5 by vacuuming the back of the sheet 5 by the vacuuming stage 15 and raising the upthrow jig 11 while holding the sheet 5. In this case, the adhesive sheet 5 is extended, so that a tension is generated. The upheaving amount of the upthrow jig 11 is set to approx. 0 to 0.5 mm on the basis of the upside of the vacuuming stage 15 so as not to break the adhesive sheet 5. However, the upheaving value of the upthrow jig is changed in accordance with the size of the adhesive sheet 5 or semiconductor chip 2 used but it is not restricted to a value other than the above upheaving value.

After raising the upthrow jig 11 up to a predetermined value, the semiconductor chip 2 is separated from the adhesive sheet 5 by providing ultrasonic vibration in the direction vertical to the chip 2 so that the tip end of the upthrow jig 11 has a frequency of 10 to 100 kHz and an amplitude of 5 to 100 μm and providing ultrasonic vibration for the semiconductor chip 2 through the adhesive sheet 5.

Figure 19:
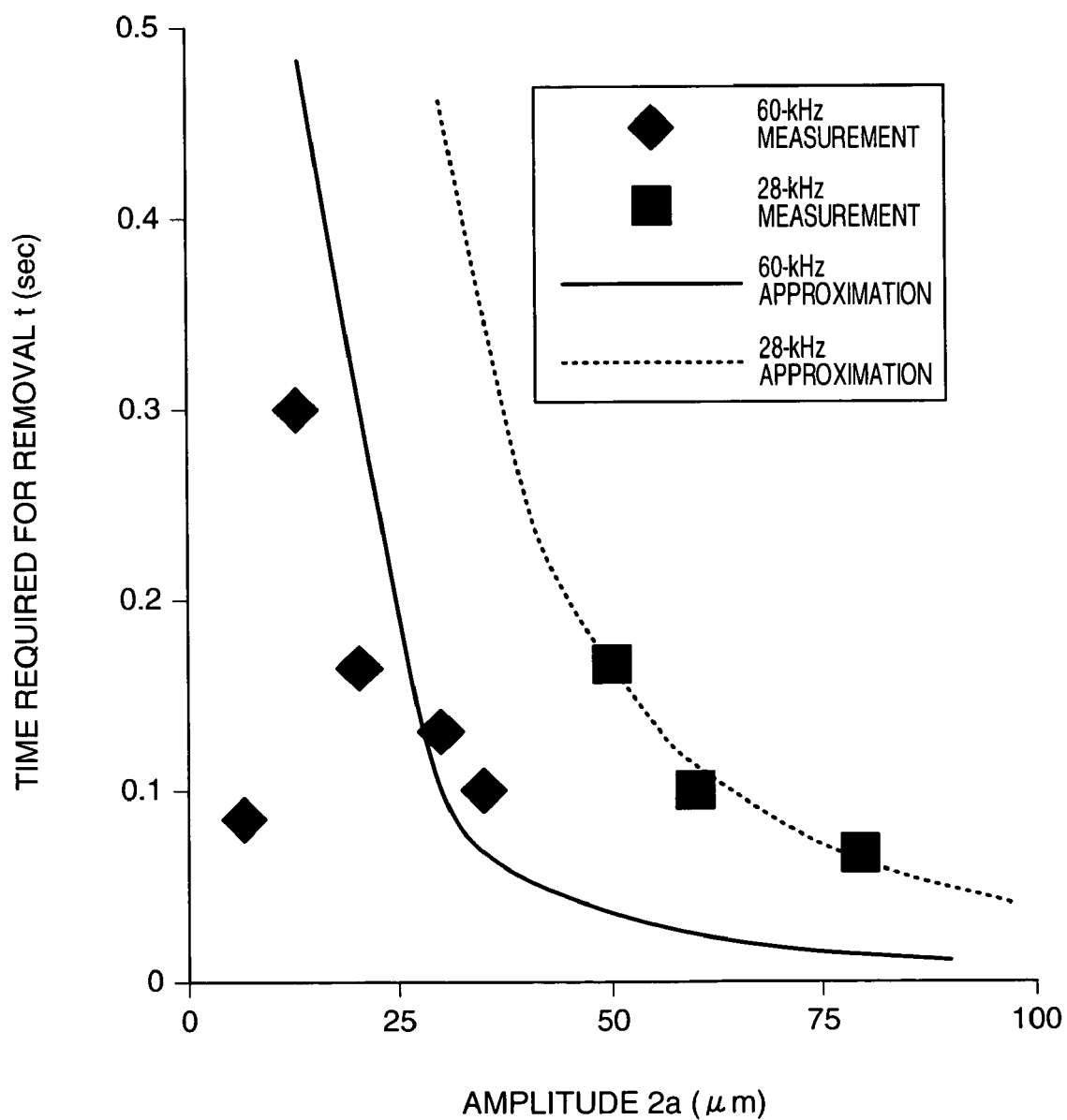
FIG. 19 is an illustration showing an example of a relation between a frequency and an amplitude of the ultrasonic wave vibration.

In this case, according to experiments by the present inventors, as shown in FIG. 19, when a frequency and an amplitude are too large, the heat due to the ultrasonic vibration by the upthrow jig 11 is increased while the time required for separation is short to dissolve the adhesive sheet. However, when the frequency and amplitude are too small, the adhesive sheet is not be dissolved but the time required for separation is increased and thus, this is not practically used.

Therefore, in the case of the frequency and amplitude of the ultrasonic wave, a frequency of 20 to 80 kHz and an amplitude of 20 to 80 μm are practical-use values.

When upheaving the semiconductor chip 2 by the upthrow jig 11 through the adhesive sheet 5, a tension is generated in the base material 4 of the adhesive sheet 5, the adhesive agent layer 3 at the boundary between the sheet base material 4 and semiconductor chip 2 is also expanded, and an adhesive agent layer 3a on the outer periphery of the semiconductor chip 2 is most expanded (FIG. 4). When vertically vibrating the upthrow jig 11 at a high speed under the above state, the adhesive agent layer 3 is repeatedly expanded and contracted at a high speed, a fatigue failure occurs in the adhesive agent layer 3, the failure progresses, and the semiconductor chip 2 is separated from the adhesive agent layer 3.

Moreover, by providing the ultrasonic wave for the upthrow jig 11, the upthrow jig 11 is heated up to several tens of degrees. However, by pressing the tip end of the heated upthrow jig 11 against the adhesive sheet 5 to which a semiconductor chip to be separated is attached, the adhesive sheet 5 is expanded and contracted, so that the semiconductor chip 2 is easily removed.

As shown in FIG. 3(b), when picking up the semiconductor chip 2, the separated semiconductor chip 2 previously moves the vacuuming collet 16 to a predetermined height at the immediately upper portion of the semiconductor chip 2 to be previously removed, and lowers and positions the collet 16, and the semiconductor chip 2 is vacuumed and held by the turned-on vacuuming collet 16 and mounted on a substrate.

The vacuuming collet 16 is turned down at a height, for example, up to approx. 0 to 0.1 mm from the upside of the semiconductor chip, so as not to contact with but come close to the upside of the semiconductor chip 2 when upthrowing the semiconductor chip 2 by the upthrow jig 11.

Thus, by using a chip separating unit to which the ultrasonic vibration are added, it is possible to obtain a thin semiconductor device having no scratch on the back of a semiconductor chip without breaking an adhesive sheet.

The semiconductor chip 2 attached on the adhesive sheet 5 fixed to the frame 7 is fixed to the pickup stage 8. The pickup stage 8 is supported by a two-shaft horizontal movement mechanism (not illustrated) to be movable so that the semiconductor chip 2 to be separated comes to the immediately upper portion of the upthrow jig 11.

Figure 3:
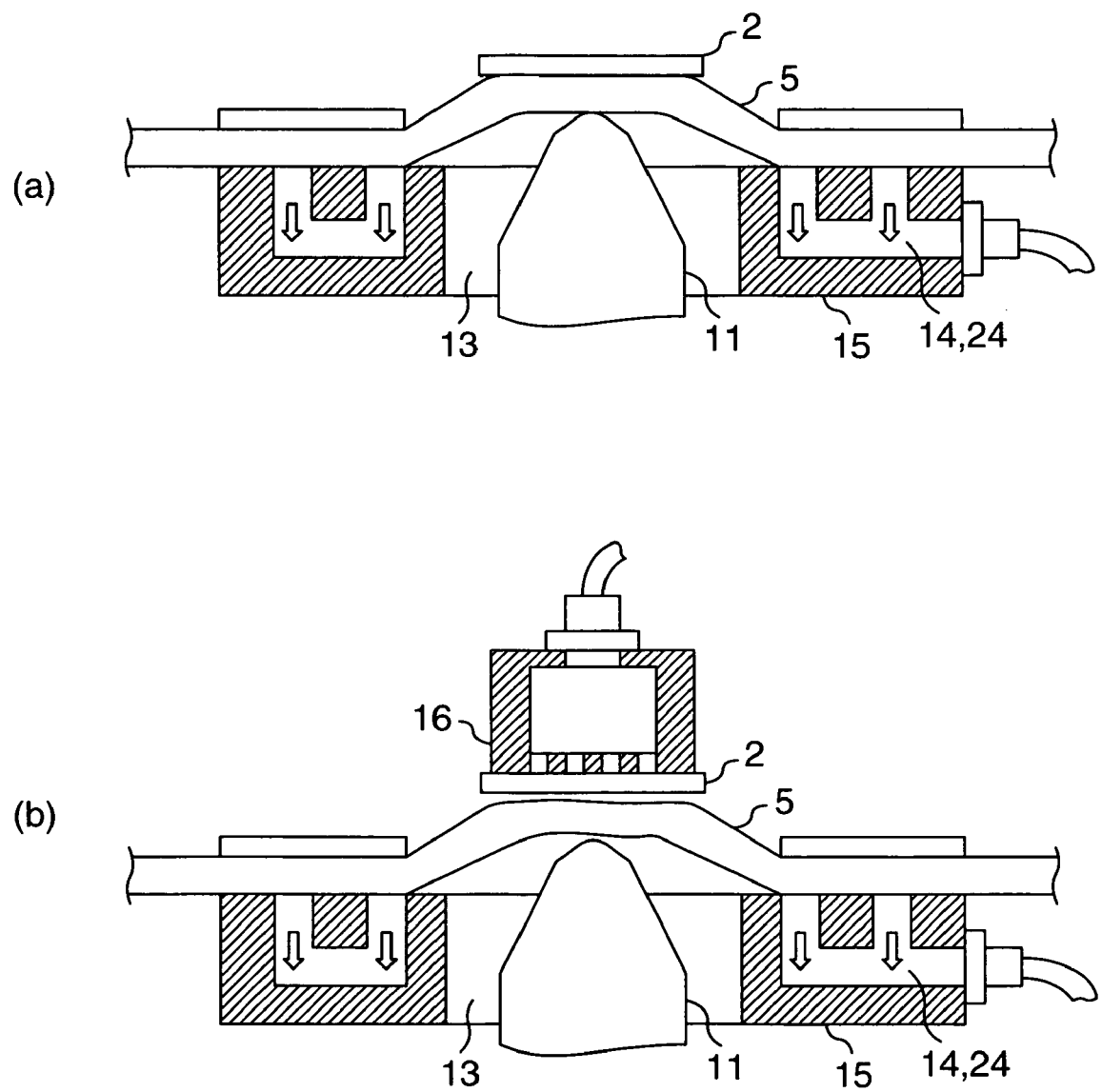
FIG. 3 shows sectional views illustrating an upthrow operation of the chip separating unit in order of steps.

Moreover, when upheaving the semiconductor chip 2 by the single upthrow jig 11, the center of the semiconductor chip 2 is generally upheaved by the tip end of the upthrow jig 11, as shown in FIG. 2 and FIG. 3. However, it is also allowed to move and position the pickup stage so as to upthrow the vicinity of a corner of the semiconductor chip 2 by the upthrow jig 11 in accordance with the chip separation theory previously described.

A plurality of vacuuming grooves 14 and a plurality of holes 24 communicating with an external vacuuming mechanism such as a vacuum pump (not illustrated) are formed on the upside of the vacuuming stage 15 facing the back of the adhesive sheet 5, so that the adhesive sheet 5 can be vacuumed and held and the vacuum cancel operation can be performed around the vacuuming grooves 14 and holes 24.

An upthrow hole 13 through which the upthrow jig 11 can be vertically moved is opened at the inside of the vacuuming grooves 14 and holes 24 of the vacuuming stage. The size and shape of the upthrow hole 13 are changed in accordance with the aperture size and shape of the tip of the upthrow jig 11, and the size of the semiconductor chip 2 to be separated. However, when a chip size is used as a reference, for example, when separating a square semiconductor chip 2, a hole is formed into a circular hole equal to or less than the diagonal length of the semiconductor chip 2 so that the chip does not fall into the upthrow hole 13. When separating a rectangular semiconductor chip 2, a slotted hole smaller than the chip size is preferable.

The vacuuming grooves 14 and vacuuming holes 24 formed at the outside of the upthrow hole 13 are formed into a shape or arrangement at which a vacuum state is kept so that a vacuum state is kept when upheaving the adhesive sheet 5 to which a semiconductor chip 2 not intended to be separated is attached by the upthrow jig 11 for example, or at which a large load such as a crack or fissure is not applied to the chip when vacuuming the adhesive sheet. Moreover, it is possible to use a method for vacuuming the adhesive sheet 5 in which innumerable vacuuming holes are formed outside of the upthrow hole 13.

Figure 5:
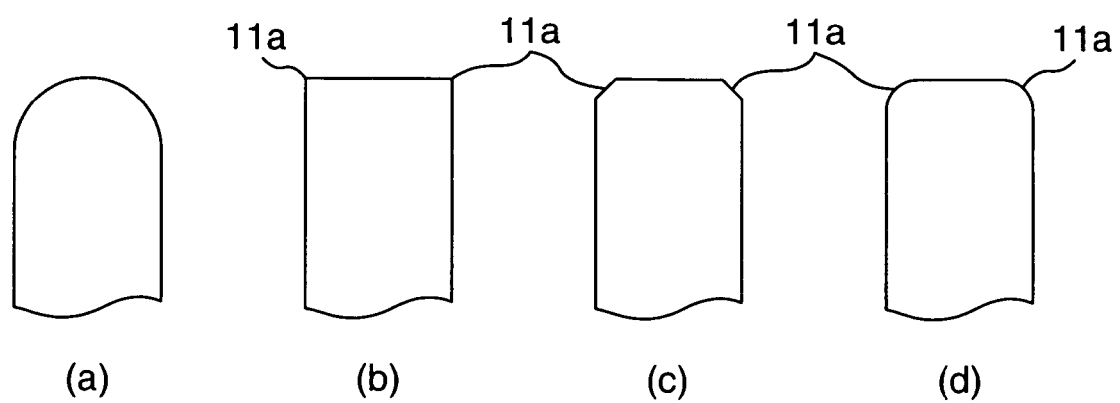
FIG. 5 shows sectional views illustrating an example of an shape of a tip end of an upthrow jig of the chip separating unit.
Figure 6:
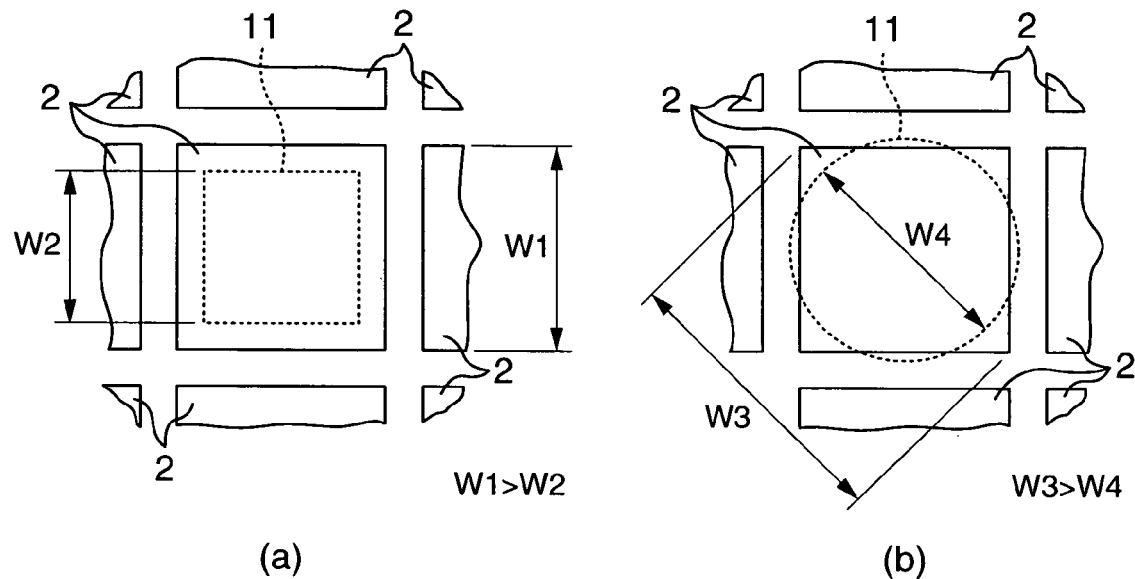
FIG. 6 shows views illustrating an example of the size of the tip end of the upthrow jig of the chip separating unit.

FIG. 5 is a sectional view showing an example of an upthrow-jig tip-end shape of the chip separating unit of this embodiment 1, and FIGS. 6(a) and 6(b) are illustrations respectively showing an example of the size of the tip end of the upthrow jig of the chip separating unit of this embodiment 1.

The ultrasonic vibrator 17 to which the upthrow jig 11 is set is supported by a vertical movement mechanism section 21. Moreover, the vibrator 17 has a structure independent of the vacuuming stage 15 and makes it possible to perform the operation for upthrowing the adhesive sheet back 5 of the semiconductor chip 2 on the upthrow hole 13 by vertically moving the upthrow jig 11 and ultrasonic vibrator 17. Furthermore, the piezoelectric device 18 for generating vibration is built in the ultrasonic vibrator 17, an ultrasonic oscillator (not illustrated) is connected to the piezoelectric device 18 and the upthrow jig 11 ultrasonic-vibrates in accordance with the on/off operation of the oscillator. The upthrow jig 11 and ultrasonic vibrator 17 are fixed by screws. When changing the shape and size of the tip end of a jig and the amplitude condition of the ultrasonic vibration in accordance with the size of a chip to be separated and adhesive sheet characteristic, it is possible to easily replace the upthrow jig 11.

The shape of the tip end of the upthrow jig 11 contacting with the back of the adhesive sheet 5 is formed into a spherical surface so as not to break the adhesive sheet in the case of a very small semiconductor chip of approx. 0.5-mm square (FIG. 6(a)). It is allowed to change R dimension of the spherical surface and the shape of the jig in accordance with the size of a chip to be removed and the characteristic of an adhesive sheet.

A large-area semiconductor chip such as a chip of 1 mm square or more is formed into the flat type same as the chip shape so that the heat due to ultrasonic vibration and the internal friction heat of an adhesive sheet caused by the ultrasonic vibration is effectively propagated to the whole adhesive face to which a semiconductor chip is attached in a short time (FIG. 5(b)). Because the edge portion 11a of the tip end may break the adhesive sheet, it is preferable to apply C chamfering (FIG. 5(c)) or R chamfering (FIG. 5(d)) to the edge portion 11a. Moreover, it is possible to use a spherical surface. It is also allowed to change the chamfering dimension and jig shape in accordance with the size of a chip to be separated and the characteristic of an adhesive sheet. It is preferable that the aperture dimension of the upthrow jig, in the case of a quadrangle, is a quadrangle W2 smaller than a chip size W1 of the semiconductor chip so that the adhesive agent layer at the outer periphery of the chip is expanded and the ultrasonic vibration is propagated to the outer periphery of the chip (FIG. 6(a)) in accordance with the chip separation theory shown in FIG. 4. Moreover, in the case of a circle, a diameter W4 is preferable, which is smaller than a chip diagonal length W3 in view of the same consideration as the case with the square (FIG. 6(b)).

In the case of this embodiment 1, a chip separation to which the ultrasonic vibration is added is performed in accordance with the vertical movement of the single upthrow jig 11. Therefore, for example, only by changing the shape and aperture dimension of the upthrow jig 11 in accordance with the size of the semiconductor chip 2, this can be applied to all type of pickup of the semiconductor chips 2, from a comparatively-large semiconductor chip 2 to a very small semiconductor chip 2 having one side of several millimeters or less, and it is possible to obtain a semiconductor device constituted by the semiconductor chip 2 of all sizes having no scratch on the back of the chip. Moreover, in the case of this embodiment, a chip is separated by a single upthrow jig. However, in the case of a large semiconductor chip or a rectangular semiconductor chip, it is allowed to use a chip separating unit for separating the semiconductor chip 2 by using a plurality of upthrow jigs.

There are many types of the adhesive sheet 5 to which the semiconductor chip 2 is attached, which are selected in accordance with the purpose. The adhesive sheet 5 suitable for the chip separating unit of embodiment 1 of the present invention shown in FIG. 2 and 3, namely, the sheet base material 4 depends on a chip size.

According to experiments by the present inventors, in the case of a very small chip of 0.5-mm square or less, an easily-extendable base material such as PO (polyolefin) can be stably separated. This is because the sheet base material uses a not-easily extended material such as PET or PVC which is a rigid plastic and thereby easily propagates vibration, and the influence of an ultrasonic wave is widened and therefore, an adjacent chip is separated together. However, when the base material adopts PO, it does not easily propagate the vibration because it is an elastomer. Therefore, it does not easily influence the adjacent chips. Moreover, in the case of a large-area chip of 1-mm square or more, it is possible to more stably separate a not-easily-extended chip base material. As previously described, when a sheet base material adopts a not-easily-extendable material such as PET or PVC, the adjacent chips are not separated together because the vibration is easily propagated through PET or PVC, and a large-area chip has a large adhesive area.

Moreover, when an adhesive sheet is loosened, it is not easily removed but when a tension is applied to the extendable adhesive sheet, the sheet is easily separated. Therefore, it is allowed to set an expanding mechanism (not illustrated) for uniformly extending the adhesive sheet 5 to the pickup stage 8 of the chip separating unit shown in FIG. 2.

Thus, by selecting a sheet base material of an adhesive sheet suitable for a chip size, it is possible to obtain a chip separating unit free from a separation error.

FIGS. 7(a) and 7(b) are sectional views respectively showing an example of the tip end shape of a vacuuming collet, and FIGS. 8(a) and 8(b) are sectional views respectively showing an example of arrangement of vacuuming holes of a vacuuming collet.

The vacuuming collet 16 of the chip separating unit shown in FIG. 2 is supported by two-axes movement mechanism sections 22 and 23 so as to make it possible to be moved and positioned to a position immediately above the semiconductor chip 2 attached to the adhesive sheet 5 supported by the frame 7 and carry the vacuumed and held semiconductor chip 2 to the outside.

A vacuuming hole 16a communicating with an external vacuuming mechanism such as a vacuum pump (not illustrated) is opened on the vacuuming collet 16 to make it possible to vacuum and hold the separated semiconductor chip 2 and stop holding of the chip 2.

Figure 7:
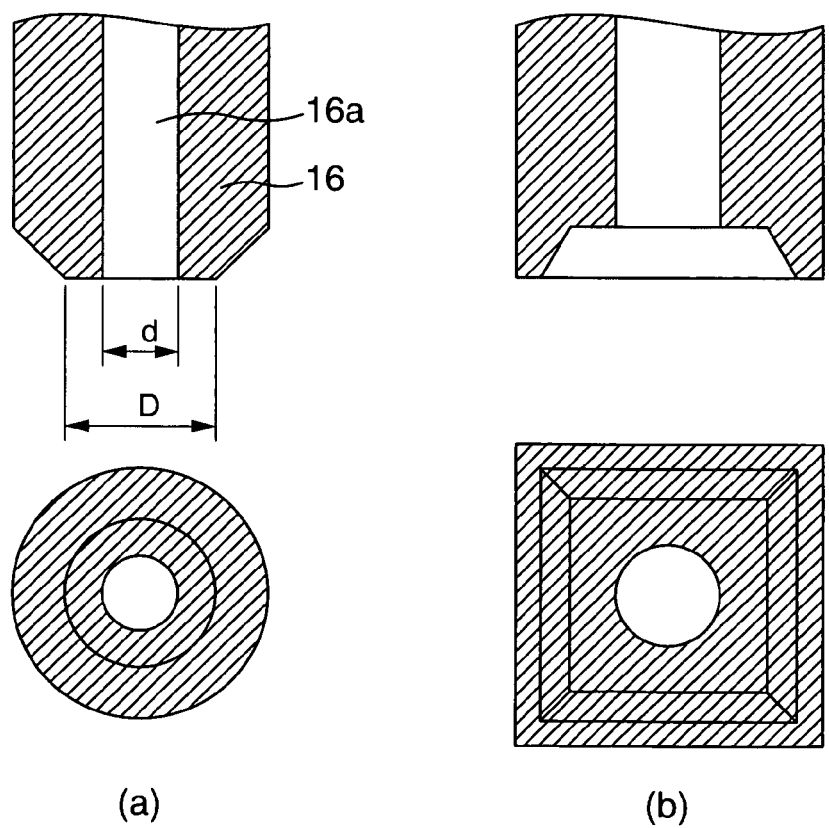
FIG. 7 shows sectional views illustrating an example of a tip end shape of a vacuuming collet.

As shown in FIG. 7, the shape of the vacuuming collet 16 for vacuuming and holding the semiconductor chip 2 generally includes a flat collet (FIG. 7(a)) for vacuuming a semiconductor chip by contacting with the upside of the chip, or a conical collet (FIG. 7(b)) for positioning a semiconductor chip with the outer periphery of the chip and vacuuming it when preventing a collet from contacting with the upside (circuit pattern face) of the semiconductor chip (FIG. 7(b)) and one of the both types is selected in accordance with a semiconductor chip to be separated.

To vacuum and hold the semiconductor chip 2 by the vacuuming collet 16, when the vacuuming hole 16a to be vacuumed to the upside of the chip is large, the chip is warped at the portion of the hole and in the worst case, the chip may be broken. The diameter of the vacuuming hole 16a of the vacuuming collet 16 contacting with the chip 2 is set to a diameter at which the chip is not deformed when vacuumed, for example, the hole diameter d is set to approx. 0.2 mm. In the case of a very small chip of approx. 0.5-mm square, it is enough to use one vacuuming hole as sown in FIG. 7(a). Moreover, when vacuuming a large-area chip of 1-mm square or more, the diameter d of the vacuuming hole contacting with the chip is set to approx. 0.2 mm as shown in FIG. 3(b) as previously described and it is preferable to use the number of vacuuming holes suitable for the chip area and form the vacuuming holes at a grid (FIG. 8(a)), staggered (FIG. 8(b)), or random arrangement.

Moreover, the tip end dimension D of the vacuuming collet to be vacuumed by a semiconductor chip is set to a size approximately equal to the size of the chip to be separated.

As a material of the tip end of the vacuuming collet 16 contacting with a chip, there are abrasion-resistant resin such as VESPEL material, electrostatic-resistant resin such as acetal copolymer, rubber having a cushioning characteristic, and metal. However, one of these substances is selected in accordance with the semiconductor chip 2 to be separated or a separating condition.

Figure 9:
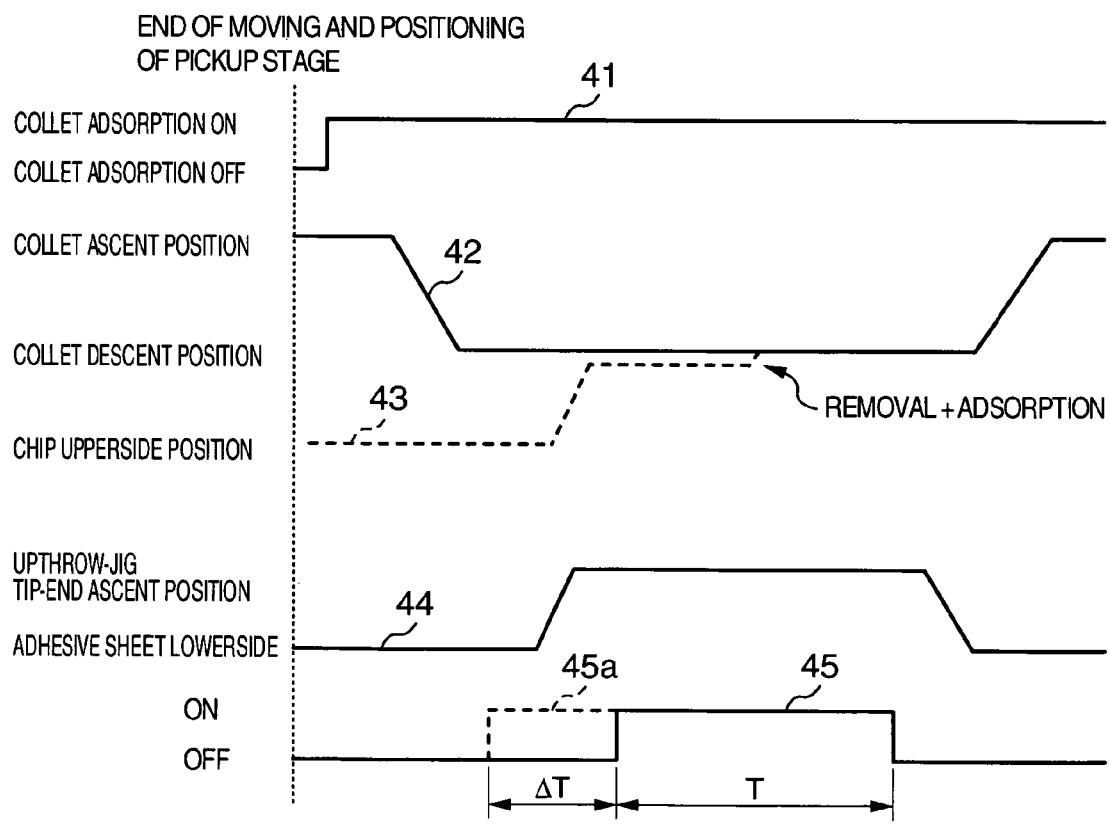
FIG. 9 is a timing chart showing an example of linked operations of various parts of the chip separating unit.

FIG. 9 is a timing chart showing an example of linked operations of various portions of the chip separating unit of this embodiment 1.

In FIG. 9, a graph 41 shows the vacuuming timing of a vacuuming collet, graph 42 shows the position of the height of a collet, graph 43 shows the upperside position of a chip, graph 44 shows the position of an upthrow jig, and graph 45 shows ultrasonic-wave applying timing.

The timing and applying time T for applying the ultrasonic vibration to an upthrow jig is approx. 0.05 to 5 sec. as an example as shown by the graph in FIG. 9.

According to experiments by the present inventors, in the case of a very small semiconductor chip of 0.5-mm square or less, the applying time is short because the adhesive area is small and the chip can be sufficiently separated for approx. 0.1 sec from the viewpoint of each size of a chip to be separated. However, in the case of a large-area semiconductor chip of 1-mm square or more, because the adhesive area is large, the chip is separated for 0.1 to 2 sec. As the chip area increases, the applying time increases. It is possible to set the applying start timing so that applying is started before or after upthrowing by an upthrow jig as shown by the graphs 45 and 45a.

Figure 18:
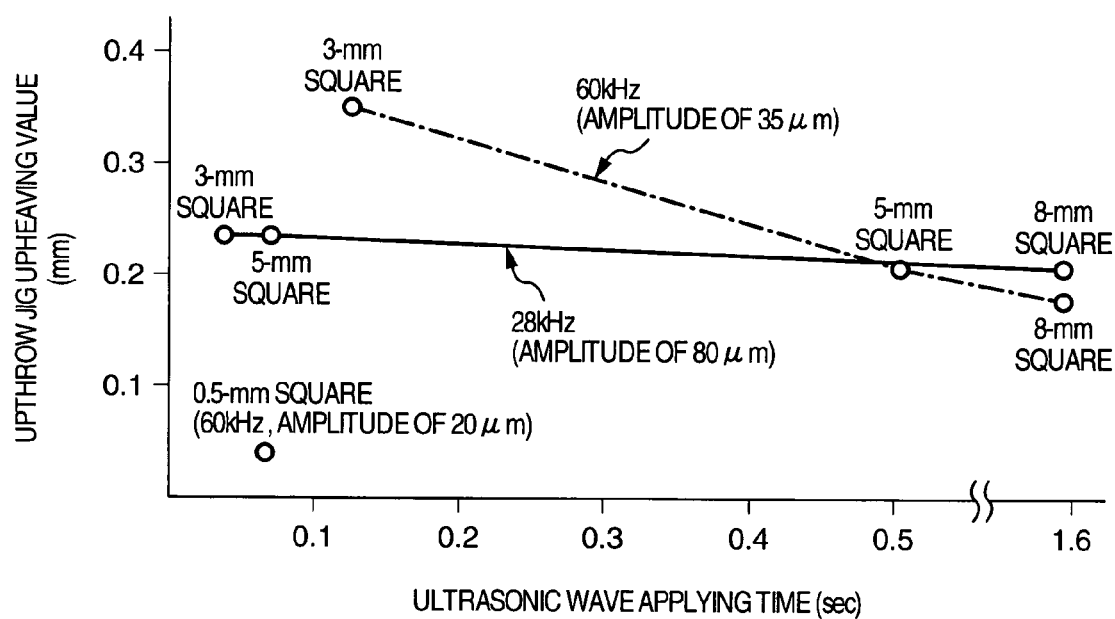
FIG. 18 is an illustration showing an example of a relation between the ultrasonic wave applying time and the upheaving amount of an upthrow jig with respect to the size of a semiconductor chip.

FIG. 18 is a graph showing experiment results of the ultrasonic wave applying time and the upheaving value of an upthrow jig with respect to every size of the semiconductor chip 2. Values of the experiment results are changed in accordance with the characteristic of the adhesive sheet 5 used and the aperture dimension and shape of the tip end of the upthrow jig 11.

Moreover, while not illustrated in FIG. 9, it is allowed to separate the semiconductor chip 2 in accordance with the operation sequence of applying ultrasonic vibration to an upthrow jig 11 while making the rising operation of the upthrow jig 11 synchronize with that of the vacuuming collet 16 by raising the upthrow jig 11 and lowering the vacuuming collet and thereby holding the semiconductor chip 2 to be separated and the adhesive sheet 5.

By using a chip separating unit to which the above ultrasonic vibration is added, it is possible to obtain a thin semiconductor device having no scratch on the back of a semiconductor chip without breaking an adhesive sheet.

Figure 10:
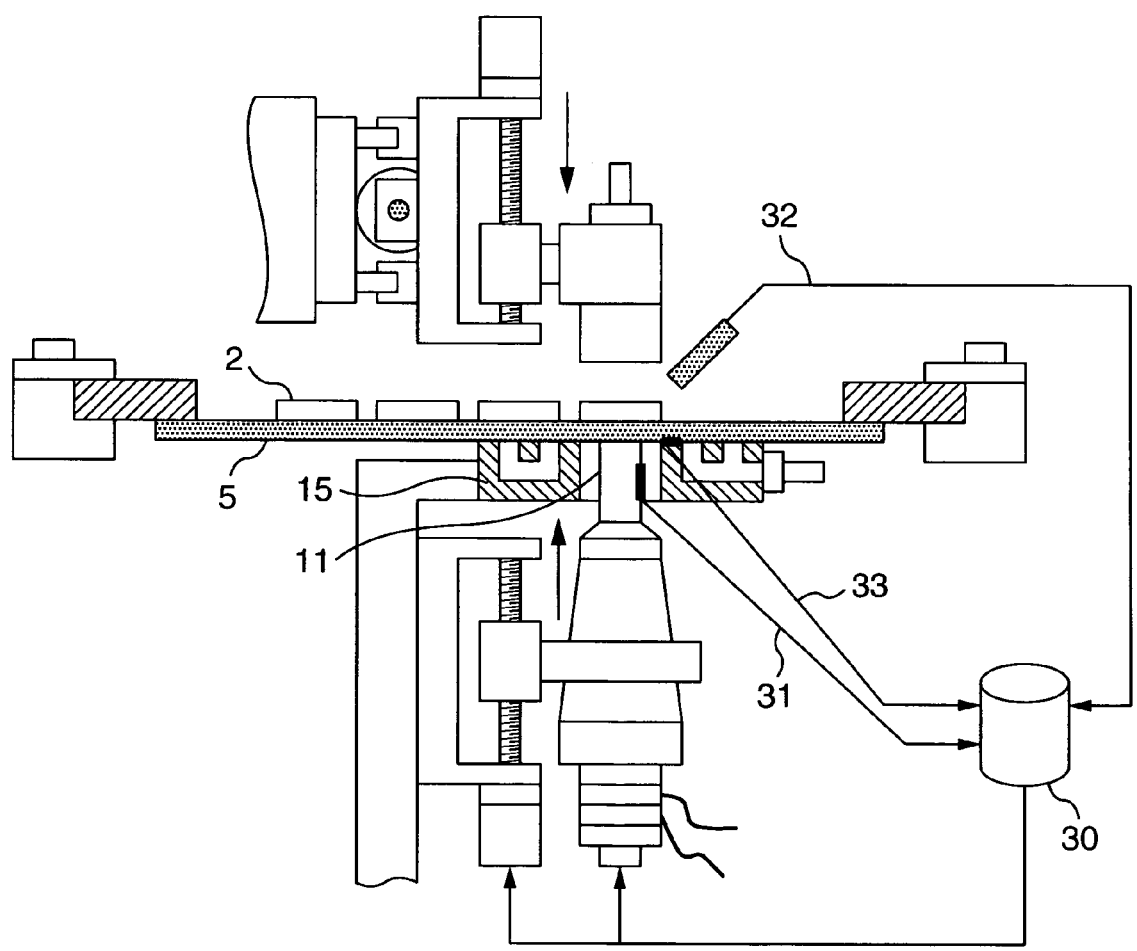
FIG. 10 is a sectional view showing a conformation of a chip separation defect prevention means to be applied to the chip separating unit.

FIG. 10 is a sectional view showing conformation 1 of imperfect chip separation preventive means in the chip separating unit of this embodiment 1.

When separating the semiconductor chip 2 by using the chip separating unit of this embodiment 1, it is allowed to use a means for measuring the temperature produced when applying ultrasonic vibration to the upthrow jig 11 and for controlling the temperature.

The chip separating unit shown in FIG. 10 separates the semiconductor chip 2 in accordance with the operation procedure of the chip separating unit of this embodiment 1. The semiconductor chip 2 to be separated vacuum-sucks the sheet backside by the vacuuming stage 15, raises the upthrow jig 11 while holding the adhesive sheet 5, and upheaves the semiconductor chip 2 through the adhesive sheet 5. After upheaving the semiconductor chip 2, the semiconductor chip 2 to be removed applies ultrasonic vibration to the upthrow jig 11.

In this case, a means 31 for measuring the tip-end temperature of the upthrow jig 11 generated due to the ultrasonic vibration, a means 32 for measuring the temperature of the semiconductor chip 2 to be separated, and a means 33 for measuring the temperature of the adhesive sheet 5 at the portion to which the chip to be separated is attached are used to measure the temperature of each portion when the ultrasonic wave is applied. By adding the heat of allowable limit or more to the semiconductor chip 2, the circuit of the semiconductor chip 2 is broken. Moreover, when adding excessive heat to the adhesive sheet 5, the adhesive sheet 5 is melted and the melted adhesive sheet 5 or adhesive agent layer 3 may be attached to the backside of the semiconductor chip 2. Furthermore, when the adhesive sheet 5 is melted, the backside of the semiconductor chip 2 is exposed, and when the upthrow jig 11 contacts with the backside of the semiconductor chip 2, the backside of the semiconductor chip 2 is scratched. For these prevention measures for imperfect chip separation, a function is set, which automatically or manually adjusts the applying time of an ultrasonic wave and the upheaving value of the upthrow jig 11 so that a temperature equal to or higher than a predetermined temperature is not produced in each of the above portions in accordance with a measured value obtained by directly or indirectly measuring temperatures of the tip end of the upthrow jig 11, the semiconductor chip 2 to be separated, and adhesive sheet 5 and upthrowing them in a controller 30 together. If necessary, it is allowed to set radiation means to the tip end of an upthrow jig or a cooling fan to reduce heat to be produced.

Thus, by measuring the temperature produced by applying the ultrasonic vibration and setting a function for controlling the temperature, it is possible to obtain a thin semiconductor device having no imperfect separation.

Figure 11:
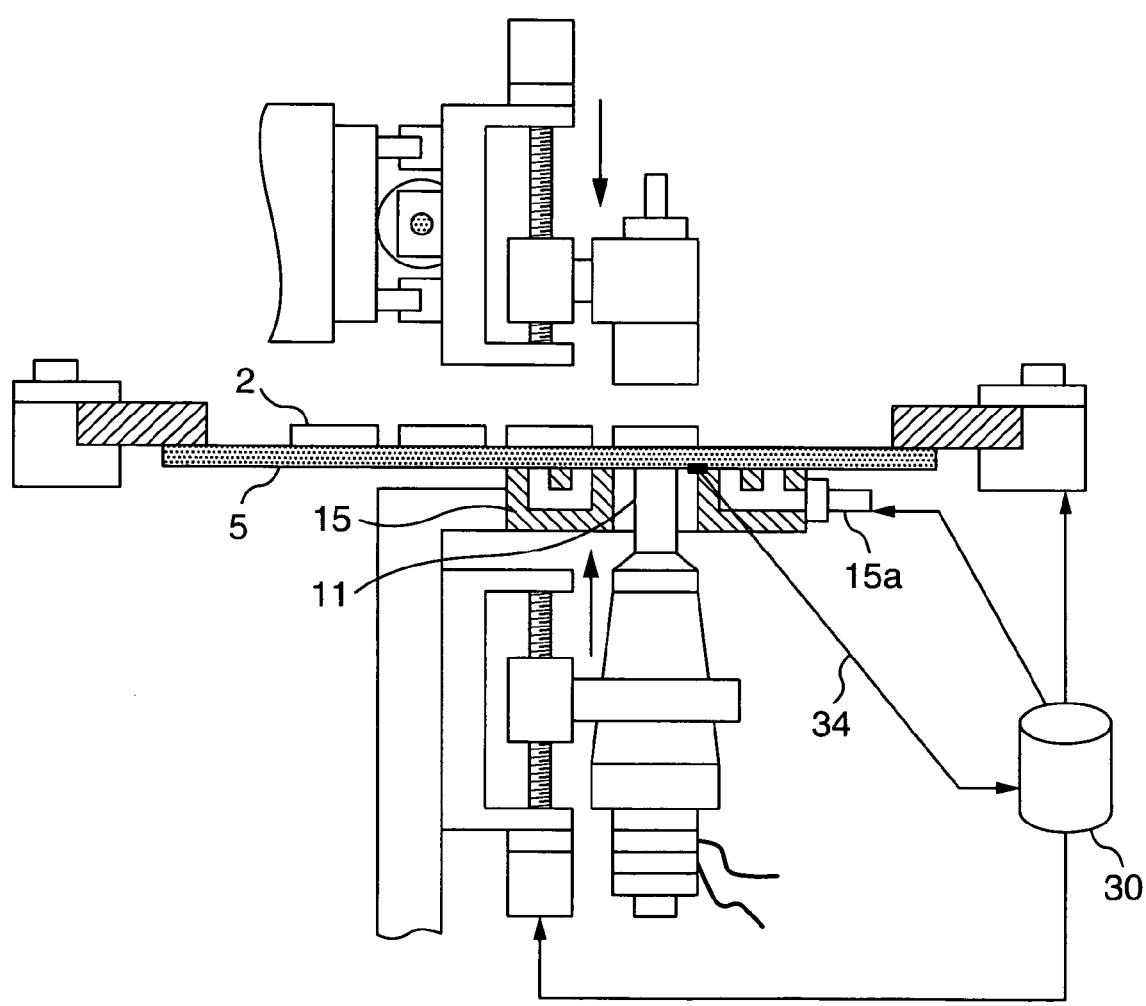
FIG. 11 is a sectional view showing a conformation of a chip separation defect prevention means to be applied to the chip separating unit.

FIG. 11 shows a sectional view of the chip separating unit of this embodiment 1 to which an imperfect chip separation prevention means is added.

When separating the semiconductor chip 2 by using the chip separating unit of this embodiment 1, it is allowed to use a means for measuring the tension of the adhesive sheet 5 produced when upheaving the semiconductor chip 2 by the upthrow jig 11 through the adhesive sheet 5 and applying ultrasonic vibration to control the tension of the adhesive sheet.

The chip separating unit shown in FIG. 11 separates the semiconductor chip 2 in accordance with the operation procedure of the chip separating unit of this embodiment 1. The semiconductor chip 2 to be separated is upheaved through the adhesive sheet 5 by vacuuming the sheet backside by the vacuuming stage 15, raising the upthrow jig 11 while vacuuming and holding the adhesive sheet 5, and upheaves the semiconductor chip 2. After the semiconductor chip 2 is upheaved, ultrasonic vibration is applied to the upthrow jig 11. In this case, a tension is produced in the adhesive sheet 5 by upheaving by the upthrow jig 11 and the amplitude of the ultrasonic vibration and the semiconductor chip 2 is deflected. When the upthrow value of the upthrow jig 11 and the amplitude of ultrasonic vibration are large, the deflection of the semiconductor chip 2 is also increased. In the worst case, fissures or cracks occurs on the semiconductor chip 2. Moreover, the deflection of the semiconductor chip 2 depends on the vacuuming pressure 15a of the vacuuming stage 15 for vacuuming and holding the adhesive sheet 5. The deflection of the semiconductor chip 2 also depends on the position at which the semiconductor chip 2 is upheaved by the upthrow jig 11. For these prevention measures of imperfect chip separation, a function is set, which automatically or manually adjusts the upthrow value of the upthrow jig 11, vacuum pressure 15a of a vacuuming stage, or positions of the semiconductor chip 2 and upthrow jig 11 so that an excessive tension is not produced in the adhesive sheet 5 in accordance with a measured value obtained by using means 34 for measuring tensions of the adhesive sheet 5 around the semiconductor chip 2 to be separated, measuring the sheet tensions, and upthrowing them in the controller 30.

Thus, by using a function for measuring tensions of the adhesive sheet 5 produced when upthrowing is performed by the upthrow jig 11 and ultrasonic vibration is applied and controlling the tensions, it is possible to obtain a thin semiconductor device having no imperfect separation.

When separating and picking up the semiconductor chip 2 by the chip separating unit of this embodiment 1, it is preferable to set a function (retry function) for applying the same separating operation again to the semiconductor chip 2 failing in chip separation from the adhesive sheet 5 at the first-time separating operation. It is preferable to provide an operation sequence for not performing separating operation any more when separation cannot be performed again for this function.

The following is the separation processing using the function.

Firstly, the pickup stage 8 is moved to move the semiconductor chip 2 to be separated to the position immediately above the upthrow jig 11. The semiconductor chip 2 to be separated vacuum-sucks the sheet backside by the vacuuming stage 15. The vacuum-sucking of the vacuuming collet 16 is operated to lower the vacuuming collet 16. While vacuuming and holding the adhesive sheet 5, the upthrow jig 11 is raised to upheave the semiconductor chip 2 through the adhesive sheet 5. After upheaving the semiconductor chip 2, by applying ultrasonic vibration to the upthrow pin 11 and the semiconductor chip 2 through the sheet 5, the semiconductor chip 2 is separated from the sheet and vacuumed and held by the vacuuming collet 16 to raise the vacuuming collet 16. The quality of chip separation is determined by using a function for measuring the vacuuming pressure or vacuuming flow rate of the vacuuming collet 16 or a function for determining presence or absence of a chip by setting a sensor to a vacuuming hole of the vacuuming collet 16. When the semiconductor chip 2 is not vacuumed by the vacuuming collet 16, the number of retry times is counted by a counter or the like. The same separating operation is applied to the semiconductor chip 2 again which cannot be separated from the adhesive sheet 5. However, when the semiconductor chip 2 cannot be still separated after applying the separating operation to the chip again, the separating operation is not applied any more to the semiconductor chip 2 which cannot be separated again but another semiconductor chip 2 is separated by canceling vacuum states of the vacuuming collet and vacuuming stage.

In this case, the semiconductor chip 2 which cannot be separated through the second-time separating operation, the adhesive force of, for example, the adhesive agent layer is not deteriorated, or a chip which cannot be separated due to the reason such as imperfect upthrowing in a dicing step is brought into a specific state and therefore, it cannot be separated at a high probability even if retry is performed again. Moreover, the number of opportunities for providing a damage for the semiconductor chip 2 is increased by repeating separating operation a plurality of times and thereby applying ultrasonic vibration to the semiconductor chip 2 and adhesive sheet 5 by the number of repetitive separating operations. Therefore, it is preferable that separating operation is not applied to one chip three times or more.

By restricting the number of retries for performing separating operation again to a semiconductor chip which cannot be separated, it is possible to obtain a thin semiconductor device having no damage due to separation.

Figure 12:
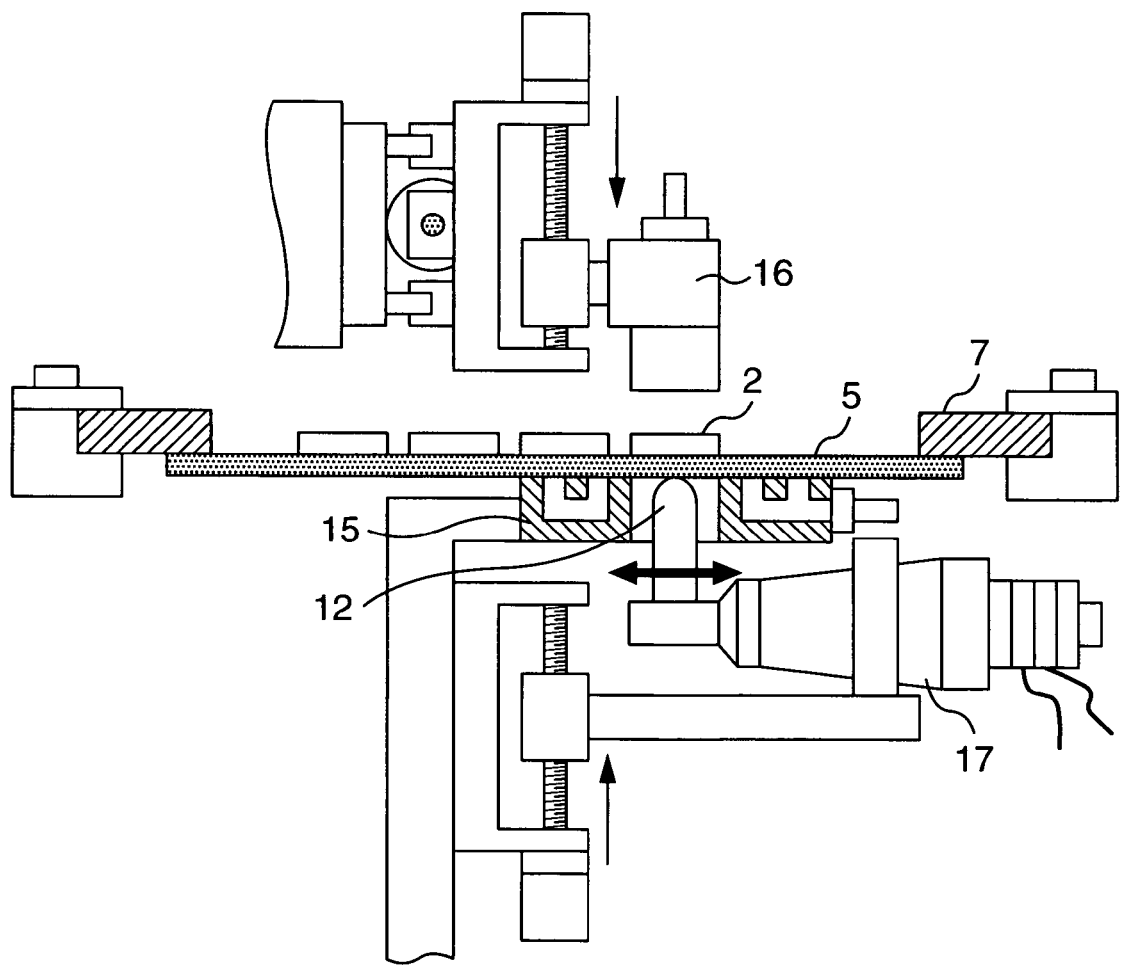
FIG. 12 is a sectional view showing a chip separating unit used for a semiconductor device fabrication method.

FIG. 12 is a sectional view showing a chip separating unit used for a fabrication method of a semiconductor device of second embodiment 2.

In the case of the chip separating unit of embodiment 1, the vibration direction and amplitude direction of the ultrasonic wave is vertical to the semiconductor chip 2. However, as shown in FIG. 12, it is allowed to use a device configuration for applying horizontal-directional ultrasonic vibration to the semiconductor chip 2. Also when the vibration direction is horizontal, the chip separating operation has the same operation procedure as the case of above embodiment 1.

A semiconductor chip 2 to be separated is upheaved through a adhesive sheet 5 by vacuuming the back of the adhesive sheet 5 by a vacuuming stage 15 and raising an upthrow jig 12 while holding the adhesive sheet 5. After upheaving the semiconductor chip 2, the horizontal-directional ultrasonic vibration having a frequency of 20 to 80 kHz and an amplitude of 20 to 80 µm is applied to the upthrow jig 12 and the semiconductor chip 2 through the adhesive sheet 5, it is possible to separate the semiconductor chip 2 from the adhesive sheet 5. In this case, as shown in FIG. 4, when the semiconductor chip 2 is upheaved by the upthrow jig 12 through the adhesive sheet 5, a tension is produced in the sheet base material 4 of the adhesive sheet 5, the adhesive agent layer 3 present at the boundary between the base material 4 and the chip 2 is expanded, and an adhesive agent layer 3a on the outer periphery of the semiconductor chip 2 is most expanded. When vibrating the upthrow jig 12 at a high speed in the horizontal direction under the above state, the adhesive agent layer 3 is repeatedly extended and contracted at a high speed, a fatigue failure occurs in the adhesive agent layer 3, the failure is progressed, and the semiconductor chip 2 is separated from the adhesive agent layer 3. Moreover, by applying the ultrasonic vibration to the upthrow jig 12, the upthrow jig 12 is heated up to several tens of degrees. However, by pressing the tip end of the heated upthrow jig 12 against the adhesive sheet 5 to which the semiconductor chip 2 to be separated is attached, the adhesive sheet 5 is expanded and contracted and thereby, the semiconductor chip 2 becomes easily removed. Furthermore, because friction heat is produced by rubbing the back of the adhesive sheet 5 at a high speed and the adhesive sheet 5 is expanded and contracted, the semiconductor chip 2 becomes easily removed.

Furthermore, the same advantage can be obtained from a vibration method for changing angles for setting an upthrow jig and ultrasonic wave oscillator and tilting a vibration direction. Furthermore, the same advantage can be obtained from a two-dimensional vibration direction in which vertical and horizontal directional vibrations are compounded.

Figure 13:
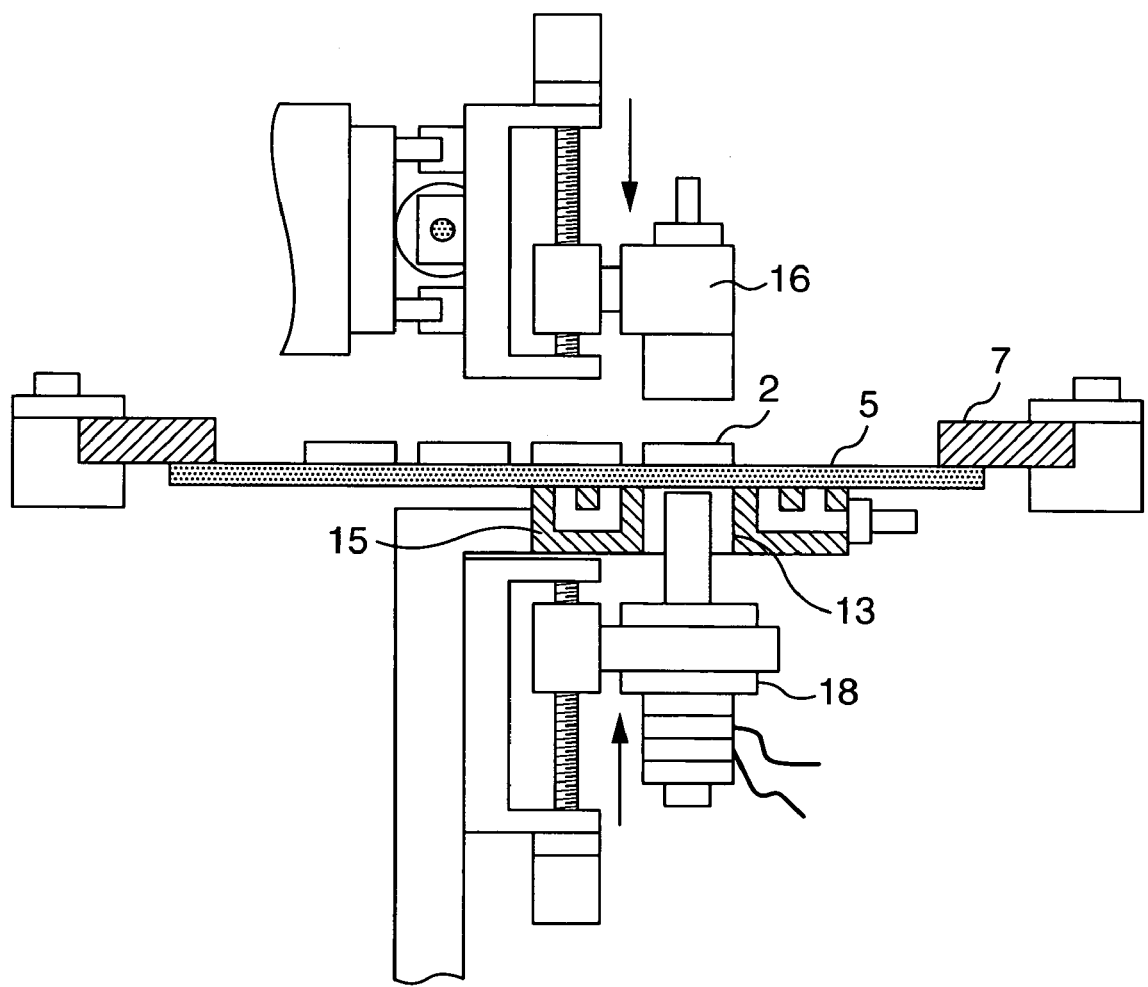
FIG. 13 is a sectional view showing a chip separating unit.

FIG. 13 is a sectional view showing a chip separating unit used for a fabrication method of a semiconductor device of embodiment 3 of the present invention.

In the case of the chip separating unit of embodiment 1, the upthrow jig 11 is set to the ultrasonic wave oscillator 17 having built-in piezoelectric device 18 to use the upthrow jig 11 so that the aperture dimension and shape of the jig 11 can be changed or the frequency and amplitude of ultrasonic vibration can be changed in accordance with the size of the semiconductor chip 2 to be separated. However, it is also allowed to use a device for separating the semiconductor chip 2 by the single piezoelectric device 18 not through the upthrow jig 11.

The chip separating unit of embodiment 3 separates a chip in accordance with the same operation procedure as embodiment 1. A semiconductor chip 2 to be separated is upheaved by the tip end of a piezoelectric device 18 through an adhesive sheet 5 by vacuuming the back of the sheet by a vacuuming stage 15 and raising the piezoelectric device 18 while holding the adhesive sheet 5. After upheaving the semiconductor chip 2, the semiconductor chip 2 is separated from the adhesive sheet 5 by supplying a current to the piezoelectric device 18 and applying ultrasonic vibration to the semiconductor chip 2 through the adhesive sheet 5. In this case, the piezoelectric device is selected so that the tip end thereof generates vibration of a frequency of 20 to 80 kHz and an amplitude of 20 to 80 µm.

Figure 14:
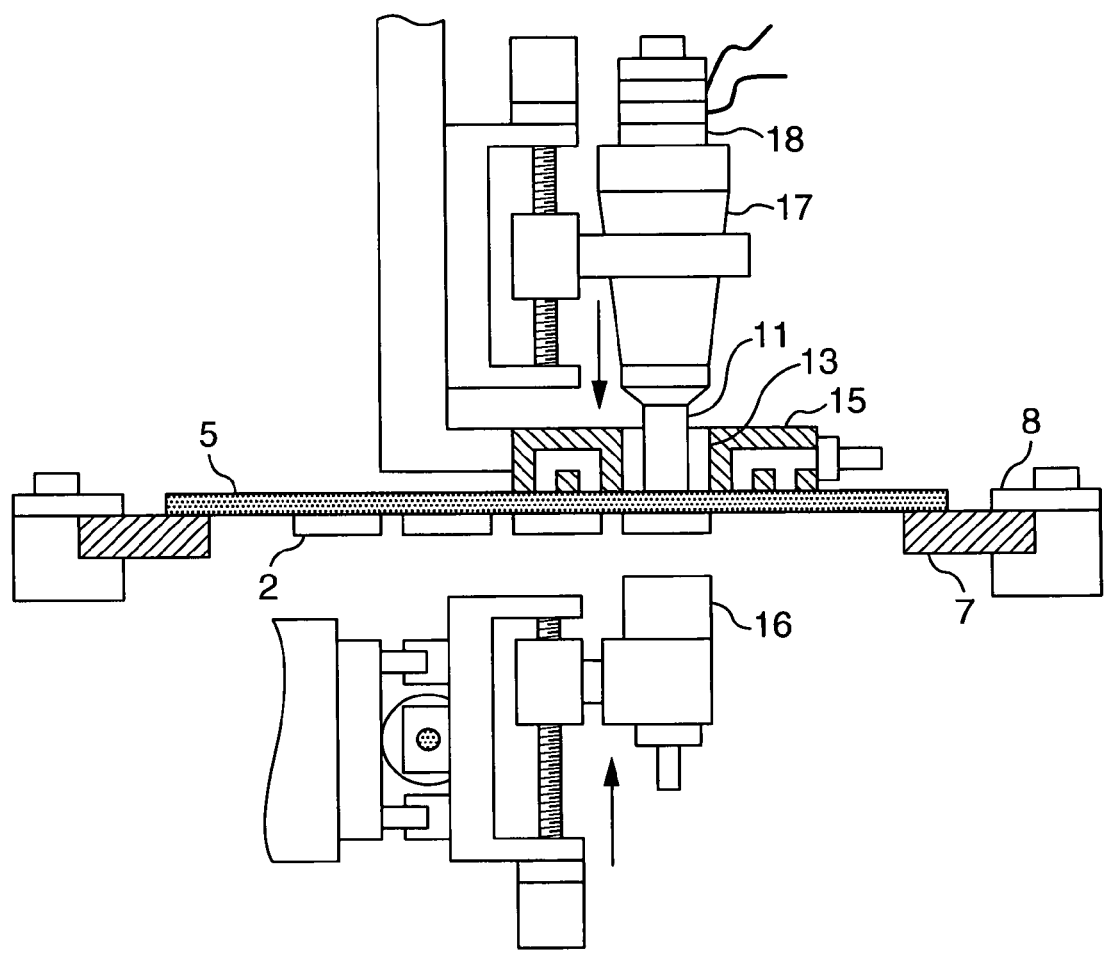
FIG. 14 is a sectional view showing a chip separating unit.

FIG. 14 is a sectional view showing a chip separating unit used for a fabrication method of a semiconductor device of embodiment 4.

In the case of the chip separating unit of embodiment 1, the semiconductor chip 2 attached to the adhesive sheet 5 is separated by raising the upthrow jig 11 from the backside of the sheet. However, it is also allowed to separate the semiconductor chip 2 by a device configuration in which all constituting devices are vertically reversed.

A chip separating unit of embodiment 4 has a pickup stage 8 for supporting an adhesive sheet 5 to which a semiconductor chip 2 having experienced a dicing step is attached and a frame 7 and performing horizontal movement and positioning, a vacuuming stage 15 located above the pickup stage 8 to vacuum the back of the adhesive sheet 5, an upthrow jig 11 located so as to be able to raise or lower a upthrow hole 13 at the center of the vacuuming stage to upthrow the adhesive sheet 5 and semiconductor chip 2, an ultrasonic oscillator 17 having a built-in piezoelectric device 18 for generating ultrasonic vibration in the upthrow jig 11 below the upthrow jig 11, and a vacuuming collet 16 for vacuuming and holding the separated semiconductor chip 2 and carrying and mounting it to and on the next step below the pickup stage 8.

Firstly, the semiconductor chip 2 attached onto the adhesive sheet 5 fixed to the frame 7 is fixed to the pickup stage 8 is fixed so that the circuit pattern face of the semiconductor chip 2 is turned downward. The semiconductor chip 2 to be separated is pressed by the tip end of the upthrow jig 11 through the adhesive sheet 5 by vacuuming the back of the sheet by the vacuuming stage 15 and lowering the upthrow jig 11 while holding the sheet 5. After lowering the upthrow jig 11 by a predetermined value, the tip end of the upthrow jig 11 applies ultrasonic vibration having a frequency of 20 to 80 kHz and an amplitude of 20 to 80 μm to the semiconductor chip 2 through the adhesive sheet 5 and thereby, it is possible to separate the semiconductor chip 2 from the adhesive sheet 5. When picking up the semiconductor chip 2, the separated semiconductor chip 2 previously moves the vacuuming collet 16 to a predetermined height immediately below the semiconductor chip 2 to be separated, and raises and positions the semiconductor chip 2, and vacuums and holds the chip 2 on the circuit pattern face by the vacuuming collet 16 while its vacuum-sucking is turned on. Then, the back of the chip is vacuumed and held by another not-illustrated vacuuming collet to mount the chip on a chip arranging vessel (tray) or mount it on a substrate on which a device will be mounted so as to turn the circuit pattern face of the chip downward.

Moreover, it is allowed to use a chip separating unit for setting a chip arranging vessel provided with a mechanism capable of three-dimensionally moving below the semiconductor chip 2, raising the vessel up to a height close to the chip, and directly mounting the chip separated by ultrasonic vibration on the vessel while the circuit pattern face is turned downward.

Thus, by using the vertically-reversed device configuration, it is possible to obtain a thin semiconductor device capable of supplying the circuit patter face of a semiconductor chip so as to be turned downward.

Figure 15:
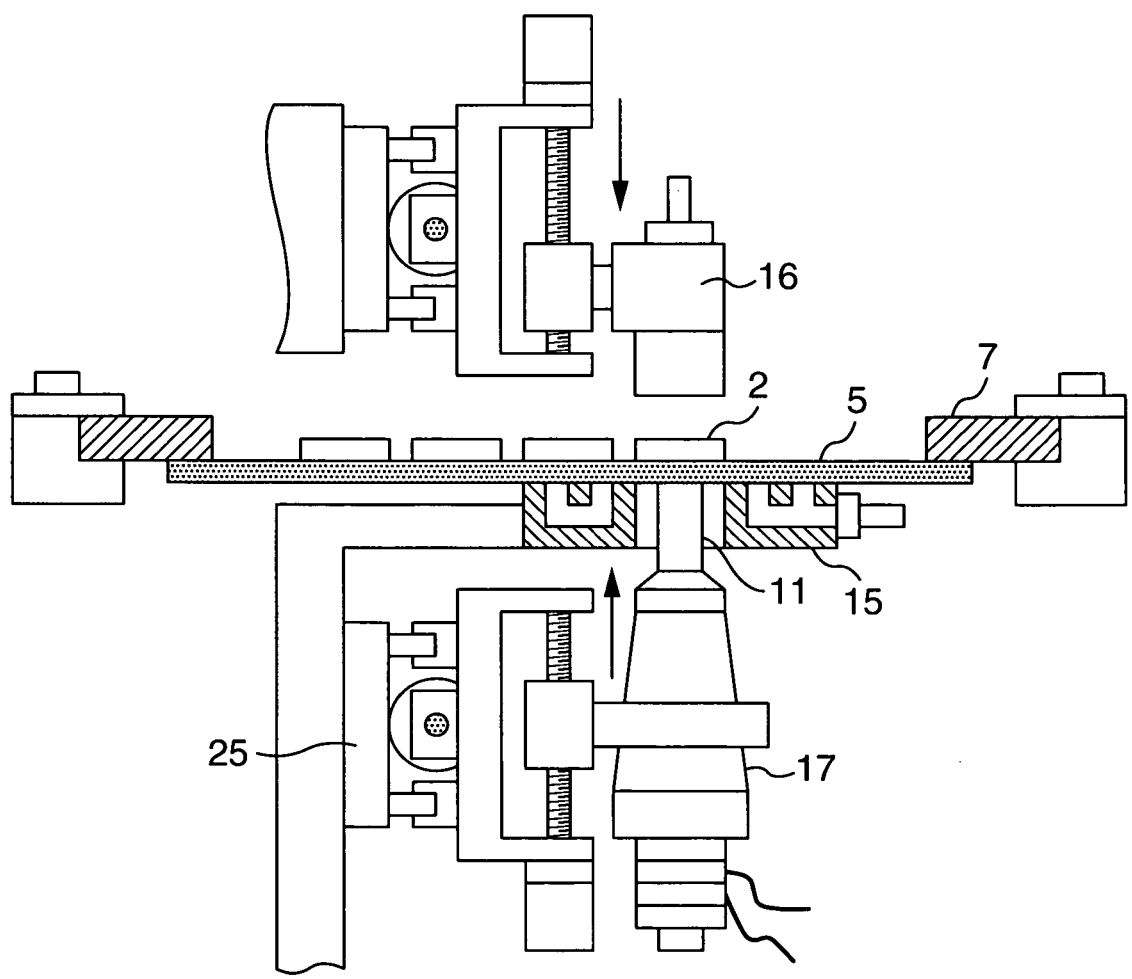
FIG. 15 is a sectional view showing a chip separating unit.
Figure 17:
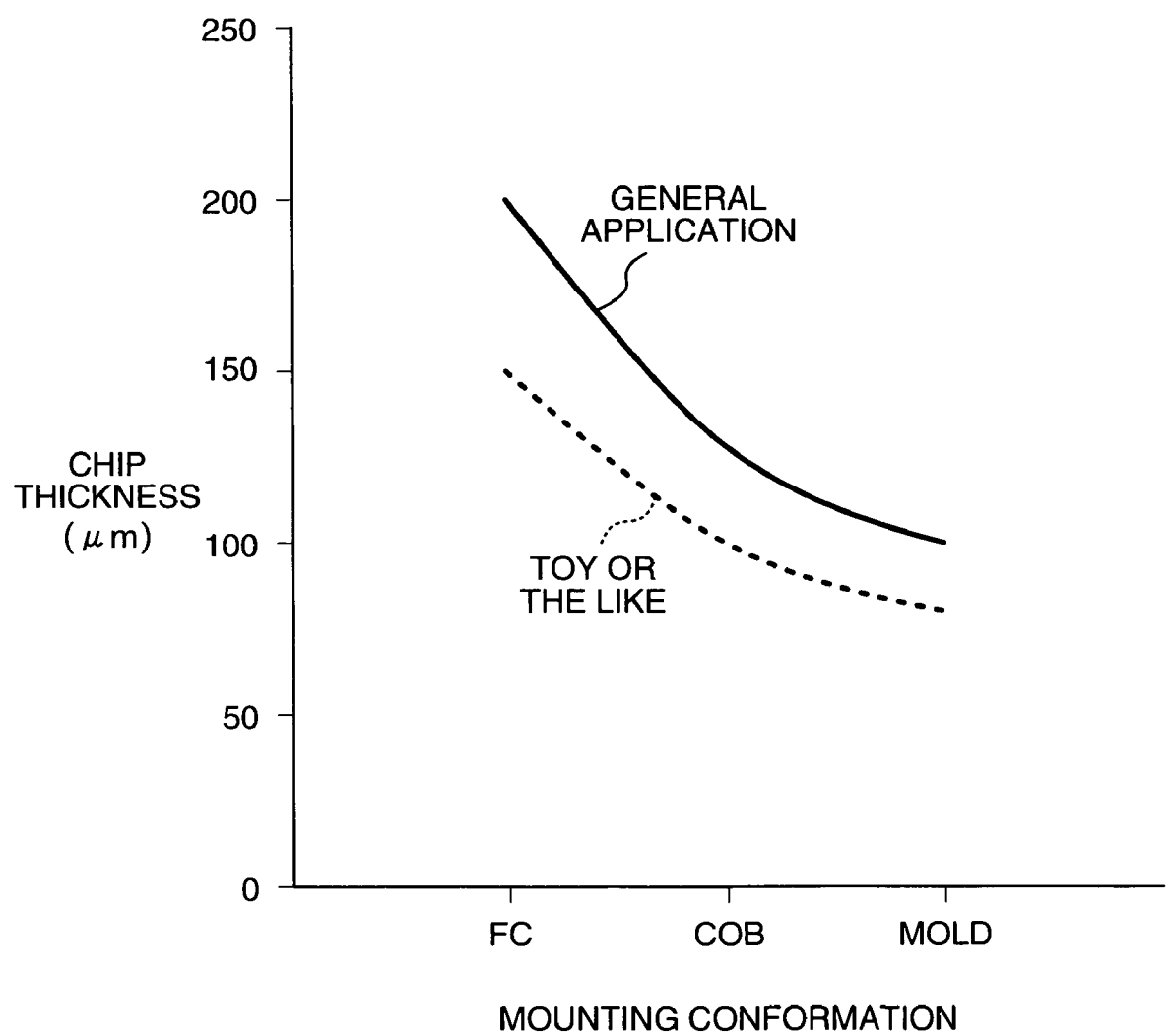
FIG. 17 is an illustration showing limit values of applicable semiconductor chip thicknesses in correspondence with various mounting conformations and applications in the case of fabricating the semiconductor chip by a process in which impressions and scratches may occur on a backside of the semiconductor chip.

FIG. 15 is a sectional view showing a chip separating unit use for a fabrication method of a semiconductor device of embodiment 5, and FIGS. 16(a) to 16(c) are illustrations respectively showing an example of a moving track of the upthrow jig of the embodiment 5.

The chip separating unit of embodiment 1 uses the elevating operation by only one axis for raising the upthrow jig 11 up to a predetermined value, applying ultrasonic vibration to the upthrow jig 11 for a predetermined time, and lowering the upthrow jig 11 up to the initial position after the vibration is completed. However, it is also allowed to use a mechanism for raising the upthrow jig 11 and moving the upthrow jig 11 into the horizontal face of the semiconductor chip 2 while applying the ultrasonic vibration to the upthrow jig 11.

As shown in FIG. 15, the chip separating unit of the embodiment 5 upheaves a semiconductor chip 2 to be separated through an adhesive sheet 5 by vacuuming the back of the adhesive sheet 5 by a vacuuming stage 15 and raising the upthrow jig 11 while vacuuming and holding the sheet 5. After upheaving the chip 2, ultrasonic vibration having a frequency of 20 to 80 kHz and an amplitude of 20 to 80 μm to the upthrow jig 11 is applied. In this case, the upthrow jig 11 to which the ultrasonic vibration are applied is moved in the horizontal plane of the semiconductor chip 2 by a two-axes moving mechanism 25 to separate the chip. As shown in FIG. 16, the moving track of the tip end of the upthrow jig 11 shows a linear movement at the diagonal line of the semiconductor chip 2 (FIG. 16(a)), linear movement passing through the center of the semiconductor chip 2 (FIG. 16(b)), circular movement nearby the outer periphery and four corners of the semiconductor chip 2 (FIG. 16(c)), or irregular movement in the horizontal face of the semiconductor chip 2.

Thus, by moving the upthrow jig 11 to which the ultrasonic vibration is applied in the horizontal face of the semiconductor chip 2, it is possible to easily separate the semiconductor chip 2 without changing the upthrow jig 11 independently of the size of the semiconductor chip 2.

Figure 20:
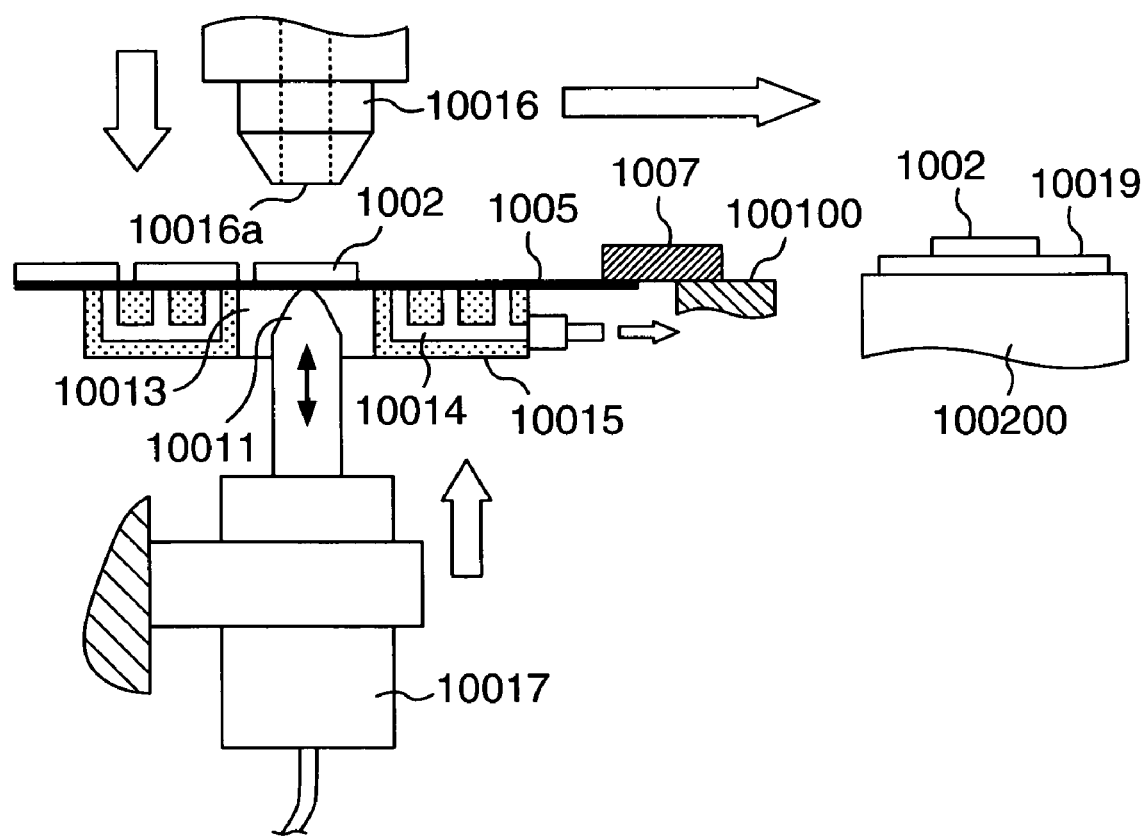
FIG. 20 is a sectional view showing an example of a configuration of a chip separating unit.

FIG. 20 is a sectional view showing an example of the configuration of a chip separating unit used for a fabrication method of a semiconductor device which is of embodiment 6 of the present invention, and FIGS. 21(a) and 21(b) are sectional views showing an example of the upthrow operation of the chip separating unit of embodiment 6 in order of the steps.

The chip separating unit of embodiment 6 has a pickup stage 100100 for supporting an adhesive sheet 1005 having experienced a dicing step and a metallic frame 1007 to perform the horizontal positioning operation, a vacuuming stage 10015 located below the pickup stage 100100, an upthrow pin 10011 set to the position of a window hole 10013 vertically movably opened on an ultrasonic wave portion of the vacuuming stage 10015, and an ultrasonic oscillator 10017 for supporting the upthrow pin 10011 to apply ultrasonic vibration to the upthrow pin 10011.

A plurality of vacuuming holes 10014 communicating with an external vacuuming mechanism are opened at the upside of the vacuuming stage 10015 facing the backside of an adhesive sheet 1005 so that the vacuum holding and vacuum canceling operations of the adhesive sheet 1005 around a window hole 10013 can be performed.

Moreover, the ultrasonic vibrator 10017 supporting the upthrow pin 10011 is supported by a not-illustrated vertical-movement mechanism and can perform a vertical movement independently of the vacuuming stage 10015 so that the upthrow operation can be performed by the upthrow pin 10011.

A vacuuming collet 10016 supported by a not-illustrated three-dimensional movement mechanism is set above the pickup stage 100100 so as to be able to move onto the position immediately above each of a plurality of semiconductor chips 1002 attached to the adhesive sheet 1005 supported by the metallic frame 1007 to position it and carry an vacuumed and held semiconductor chip 1002 to the outside.

A vacuuming hole 10016a communicating with an external vacuuming mechanism is opened at the bottom end (tip end) of the vacuuming collet 10016 so that the vacuum holding and hold canceling operations of the semiconductor chips 1002 can be performed by turning on/off the vacuuming operation to the vacuuming hole 10016a from the vacuuming mechanism.

In the pickup step in which cut thin and small semiconductor chips 1002 attached onto the adhesive sheet 1005, whose adhesive strength is deteriorated, are separated from the adhesive sheet 1005, the metallic frame 1007 and adhesive sheet 1005 are first moved so that the semiconductor chips 1002 to be separated are brought to predetermined positions. The back of the adhesive sheet of the semiconductor chips 1002 to be separated is vacuum-sucked by a vacuuming hole 10014 of the vacuuming stage 10015 to vacuum and hold the adhesive sheet 1005. In this case, the window hole 10013 has a size corresponding to one of the semiconductor chips 1002 and vacuums the adhesive sheet portion to which the semiconductor chips other than those to be separated are attached.

As described above, the upthrow pin 10011 for upthrowing the semiconductor chips 1002 is set below the vacuuming stage 10015, and the upthrow pin 10011 is vertically moved by motor driving and pneumatic driving. The ultrasonic vibrator 10017 is built in below the above upthrow pin 10011 (horn), and although not illustrated, an ultrasonic oscillator is connected to the ultrasonic vibrator 10017 so that the tip end of the upthrow pin 10011 generates ultrasonic vibration.

Operations of the chip separating unit of this embodiment 6 are described below.

When picking up the semiconductor chips 1002, the vacuuming collet 10016 is positioned to a predetermined height immediately above the semiconductor chips 1002 to be separated, and the vacuuming stage 10015 is positioned so that the window hole 10013 coincides with the position immediately below a purposed semiconductor chip 1002 to be separated and then, the back of the sheet around the window hole 10013 is vacuum-sucked by the vacuuming stage 10015 and then the upthrow pin 1011 is raised while holding the adhesive sheet 1005 to upheave the semiconductor chips 1002 through the adhesive sheet 1005 (FIG. 21(*a*)).

The height of the vacuuming collet 10016 is set to a height close to the semiconductor chips 1002 without contacting the upside of the semiconductor chips 1002 in the upthrown state by the upthrow pin 10011.

The upheaving value (amount) of the upthrow pin 10011 is set to 10 to 200 μm on the basis of the upside of the vacuuming stage 10015 (downside of the adhesive sheet 1005) to be an upheaving value so as not to break the adhesive sheet 1005. However, because the elongation amount of the sheet depends on the adhesive sheet 1005 used, the elongation amount is not restricted to the above upheaving value.

Moreover, in the case of this embodiment 6, the tip end shape of the upthrow pin 10011 is formed into a flat or circular-arc pin. By using this shape, the adhesive sheet 1005 is not easily broken when upheaving the upthrow pin 10011, and the heat due to ultrasonic vibration is easily propagated. The size of the circular arc and the angle of the tip end are set in accordance with the characteristic of an adhesive sheet used.

After raising the upthrow pin 10011 up to a predetermined value, longitudinal ultrasonic vibration is applied to the semiconductor chips 1002 from the ultrasonic vibrator 10017 through the adhesive sheet 1005 so that the tip end of the upthrow pin 10011 has a frequency of 10 to 100 kHz and an amplitude of 10 to 50 μm and thereby the semiconductor chips 1002 are removed from the adhesive sheet 1005 (FIG. 21(*b*)).

Then, in the case of this embodiment 6, by applying ultrasonic vibration to the flexible adhesive sheet 1005 and the semiconductor chips 1002 respectively having a large stiffness, the adhesive sheet 1005 causes a tension change, the portion of the adhesive agent layer 1003 is broken at the interface between the adhesive sheet 1005 and the semiconductor chips 1002 having physical properties including stiffness different from each other, and the semiconductor chips 1002 become easily removed from the adhesive sheet 1005. That is, it is possible to efficiently remove the semiconductor chips 1002 in a short time at a very high energy compared to the case of providing mechanical slides of several times for the adhesive sheet 1005 like the case of the prior art.

Moreover, by applying an ultrasonic wave to the upthrow pin 10011, the tip end of the upthrow pin 10011 is heated up to several tens of degrees. However, by pressing the heated tip end of the pin against the adhesive sheet 1005 to which the semiconductor chips 1002 to be separated are attached, the adhesive sheet 1005 is expanded and contracted and thereby, the semiconductor chips 1002 are more easily removed in cooperation with the effect of the above ultrasonic vibration.

The semiconductor chips 1002 removed from the adhesive sheet 1005 are moved to and vacuumed and held by the vacuuming collet 10016 by the vacuuming force of the vacuuming collet 10016 separated from and located at the position immediately above the adhesive sheet 1005 and mounted on a substrate 10019 on which a device will be mounted such as a lead frame on a bonding stage 100200. In this case, the timing for the vacuuming collet 10016 to vacuum the semiconductor chips 1002 may be before or after providing the ultrasonic vibration.

The linked operation of each section of the chip separating unit of this embodiment 6 is performed in accordance with the timing chart in FIG. 9.

In the case of this embodiment 6, the removal is performed by using ultrasonic vibration in accordance with the vertical movement of the single upthrow pin 10011. Therefore, just by changing the aperture dimension and shape of the upthrow pin 10011 in accordance with the size of the semiconductor chip 1002, the upthrow pin 10011 can be applied to pickup of all sizes of the semiconductor chips 1002, from a comparatively large size to a thin small size having a side of several millimeters or less, and it is possible to obtain a semiconductor device constituted by the semiconductor chips 1002 of all sizes respectively having no scratch on the backside.

As a modification of this embodiment 6, the removal is performed by using ultrasonic vibration in accordance with the vertical movement of the signal upthrow pin 10011, however, when a semiconductor chip is large, it is also possible to use a chip separating unit for removing a semiconductor chip to be removed by setting a plurality of upthrow pins in the area of the semiconductor chip to be removed, simultaneously upthrowing the semiconductor chip, and applying an ultrasonic wave to them.

As a modification of this embodiment 6, only one chip is removed by using the ultrasonic vibration in accordance with the vertical movement of the signal upthrow pin 10011. However, it is also possible to use a plurality of chip separating units same as the chip separating unit shown in FIG. 20 for simultaneously removing a plurality of semiconductor chips by setting the chip separating units in the same wafer.

As a modification of this embodiment 6, the ultrasonic vibration is applied to the upthrow pin 10011 after the upthrow pin is raised. However, it is also possible to use a procedure for upheaving the upthrow pin 10011 while applying ultrasonic vibration to the upthrow pin by considering the continuous oscillation performance of the ultrasonic wave and the exothermic theory of the ultrasonic wave inversely to the above mentioned one as the timing for oscillating the ultrasonic wave (start timing in the broken-line graph 45*a* in FIG. 9).

Figure 22:
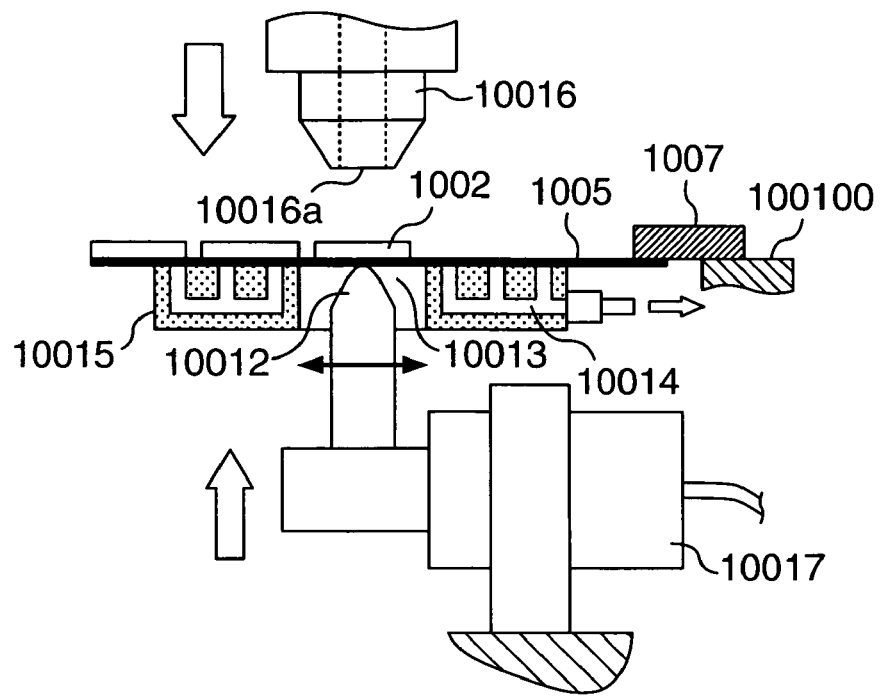
FIG. 22 is a sectional view showing a chip separating unit.

In the above description, a vibration direction and amplitude direction of the ultrasonic wave applied to the upthrow pin 10011 are longitudinal. As shown in FIG. 22, however, it is also allowed to apply a horizontal ultrasonic vibration to the upthrow pin 10012. Even when changing the vibration direction to the horizontal direction, a chip separating operation conforms to the same operation procedure as with the case of FIG. 20.

The semiconductor chip 1002 to be separated is upheaved through the adhesive sheet 1005 by vacuuming the backside of the sheet by the vacuuming stage 10015 and raising the upthrow pin 10012 while holding the adhesive sheet 1005. After upheaving the semiconductor chip 1002, a horizontal ultrasonic vibration having a frequency of 10 to 100 kHz and an amplitude of 10 to 50 µm is applied to the upthrow pin 10012 and the ultrasonic vibration is applied to the semiconductor chip 1002 through the adhesive sheet 1005, and thereby the semiconductor chip 1002a is removed from the adhesive sheet 1005. In this case, by applying the ultrasonic vibration in the horizontal direction while upheaving the semiconductor chip 1002 by the upthrow pin 10012 through the adhesive sheet 1005 to firstly rub the back of the sheet, a tension change occurs in the adhesive sheet 1005, so that the portion of the adhesive agent layer 1003 contacting with the semiconductor chip 1002 of the adhesive sheet 1005 is broken, and the semiconductor chip 1002 is easily removed. Moreover, by heating the tip end of the upthrow pin 10012 by an ultrasonic wave and rubbing the back of the sheet, friction heat is generated and the adhesive sheet 1005 is expanded and contracted, and thereby the semiconductor chip 1002 can be easily removed.

In addition to the above mentioned one, the same advantage can be obtained by a vibration method for tilting a vibration direction by changing a setting angle of the upthrow pin 10012 to the ultrasonic vibrator 10017.

Figure 23:
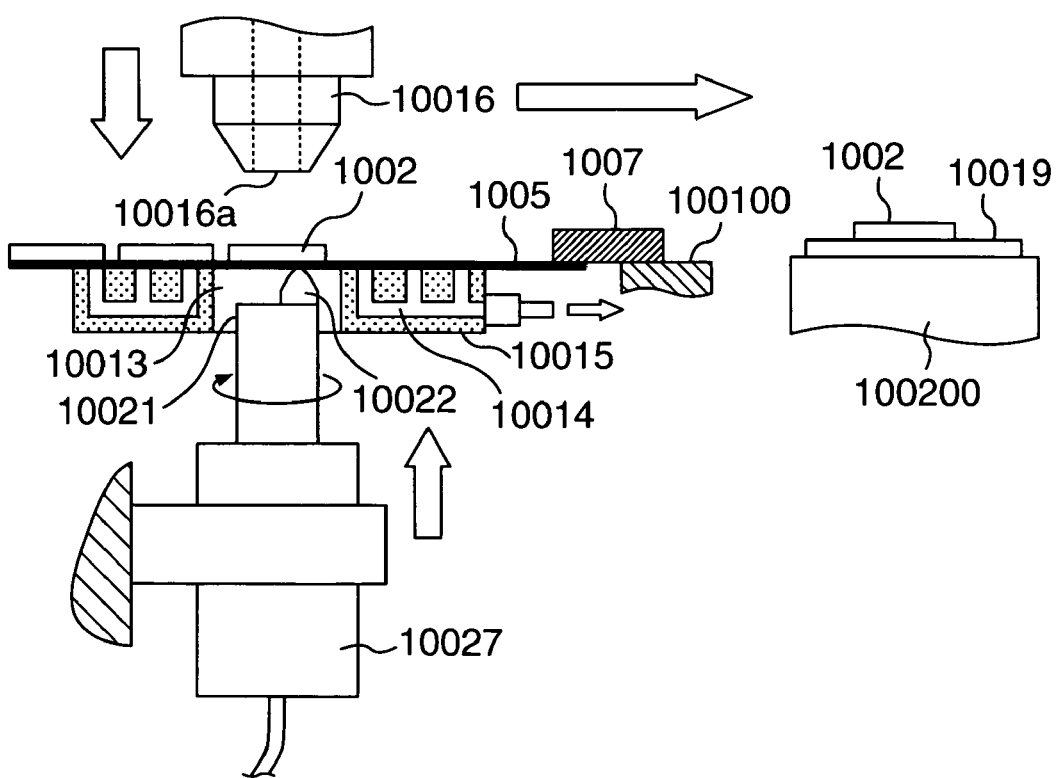
FIG. 23 is a sectional view showing a chip separating unit.

Then, a fabrication method of a semiconductor device which is embodiment 7 of the present invention is described below in detail. FIG. 23 is a sectional view showing a chip separating unit used for the fabrication method of the semiconductor device of this embodiment 7 and FIGS. 24(a) and 24(b) are sectional views showing an example of the upthrow operation of this embodiment 7 in order of the steps.

Similarly to the above embodiment 6, a backside of an adhesive sheet 1005 to which semiconductor chips 1002 are attached is vacuumed by the vacuuming hole of a vacuuming stage 10015 to vacuum and hold the adhesive sheet 1005. In this case, a window hole 10013 has a size corresponding to one of the semiconductor chips 1002 to vacuum the adhesive sheet portion to which the semiconductor chips 1002 other than those to be separated are attached.

In the case of the embodiment 7, an upthrow pin 10021 for upthrowing the semiconductor chips 1002 is set below the vacuuming stage 10015 to perform vertical movement through motor driving and pneumatic driving. A high-speed rotational motor 10027 for rotating the upthrow pin 10021 is set below the upthrow pin 10021. An eccentric pin 10022 is provided in an eccentric position at the tip end of the upthrow pin 10021.

According to the configuration in which the eccentric pin 10022 is set in the eccentric position at the tip end of the upthrow pin 10021, a mechanism is obtained, in which the eccentric pin 10022 at the tip end eccentrically whirls so as to draw a circle when the upthrow pin 10021 rotates at a high-speed.

The front-end shape of the eccentric pin 10022 is formed into a circular-arc pin. According to this shape, the adhesive sheet 1005 is not easily broken when upheaving the eccentric pin 10022, and the friction heat generated when the whirling eccentric pin 10022 rubs is easily propagated. The size of the circular arc at the tip end of the eccentric pin 10022 is set in accordance with the characteristic of the adhesive sheet 1005 used.

The semiconductor chip 1002 to be separated is upheaved through the adhesive sheet 1005 by vacuuming the back of the adhesive sheet 1005 by the vacuuming stage 10015, and raising the upthrow pin 10021 (eccentric pin 10022) while holding the adhesive sheet 1005. The upheaving value (amount) of the upthrow pin 10021 (eccentric pin 10022) is set to 10 to 200 µm on the basis of the upside of the vacuuming stage 10015 so as not to break the adhesive sheet 1005. However, because the elongation of a sheet base material 1004 depends on the adhesive sheet 1005 used, the above upheaving value is not restricted.

By raising the upthrow pin 10021 (eccentric pin 10022) up to a predetermined value and rotating the upthrow pin 10021 at a high speed, the eccentric pin 10022 set in an eccentric position whirls so as to draw a circle and slides on the downside of the adhesive sheet 1005. The rotational speed of the eccentric pin 10022 (upthrow pin 10021) is set at 1,000 to 30,000 rpm. Thus, by rubbing the adhesive sheet 1005 to which the semiconductor chips 1002 are attached by the eccentrically whirling eccentric pin 10022 at a high speed, the semiconductor chips 1002 are easily removed from the adhesive sheet 1005 in a short time.

In this case, it is preferable to set the offset value ΔR (turning radius) between the upthrow pin 10021 and eccentric pin 10022 in a range from the half of a side of a semiconductor chip 1002 to be separated (FIG. 29(a)) to the half of the diagonal length of the semiconductor chip 1002 (FIG. 29(b)). According to this structure, the tip end of the eccentric pin 10022 eccentrically whirling at the offset value ΔR rubs a portion near four sides of the semiconductor chip 1002 as shown in FIG. 29(a) or rubs by passing through the portion near four corners as shown in FIG. 29(b) and the semiconductor chip 1002 is easily removed due to a tension change of the adhesive sheet 1005 and breakage of the portion of the adhesive agent layer 1003 of the adhesive sheet 1005. This is because, when the vicinity of an end of a semiconductor chip 1002 attached to the adhesive sheet 1005 is removed, the whole is easily removed by using the removed portion as a start point. Moreover, by rubbing the back of the sheet by the eccentric pin 10022, the adhesive sheet 1005 has a friction heat and the sheet base material 1004 is more easily removed because the material 1004 causes a thermal deformation due to expansion and contraction.

The semiconductor chip 1002 removed from the adhesive sheet 1005 is separated from the adhesive sheet 1005 by a vacuuming collet 10016, and mounted on a substrate 10019 on which a device will be mounted. In this case, it is allowed to set the timing for the vacuuming collet 10016 to vacuum the semiconductor chip 1002 to the timing before or after rotating the upthrow pin 10021 (eccentric pin 10022).

By eccentrically rotating the pin and using a removal mechanism by the eccentric pin 10022 for rubbing the vicinity of a chip end, it is possible to obtain a semiconductor device having no scratch on the back of the semiconductor chip 1002 independently of the size of the semiconductor chip 1002, without breaking the adhesive sheet 1005. That is, by setting the apertures of the upthrow pin 10021 and eccentric pin 10022 and the offset value ΔR of the eccentric pin 10022 in accordance with the size of the semiconductor chip 1002, it is possible to effectively rub four sides and four corners of the semiconductor chip 1002 by the eccentric pin 10022 and use the above mentioned for a step of removing the semiconductor chips 1002 of all sizes from a thin small semiconductor chip 1002 up to a comparatively large semiconductor chip 1002.

As a modification of this embodiment 7, as shown as the graph 45 in FIG. 9, the timing for rotating the eccentric pin 10022 at a high speed rotates the eccentric pin 10022 (timing of the graph 45) after upheaving the upthrow pin 10021 in the case of the above description. However, it is also allowed to use a procedure for upheaving the upthrow pin 10021 while rotating the eccentric pin 10022 at a high speed inversely to the above mentioned (timing of the graph 45 shown by a broken line). Moreover, the continuous time T of eccentric rotation can be set to a value almost equal to the longitudinal or transverse moving time T described for another embodiment.

In addition to the abode description, the same effect can be obtained by a method for changing the setting angle of the upthrow pin 10021, tilting the upheaving direction, and whirling the eccentric pin 10022 at a high speed.

Moreover, it is allowed to set not only one eccentric pin 10022 but also a plurality of eccentric pins 10022 having offset values ΔR different from each other to the tip end of the upthrow pin 10021.

Furthermore, it is allowed to obtain the same effect as the case of high-speed whirling of the eccentric pin 10022 by rotating the upthrow pin 10021 whose tip end is formed to be irregular, instead of the eccentric pin 10022.

Figure 25:
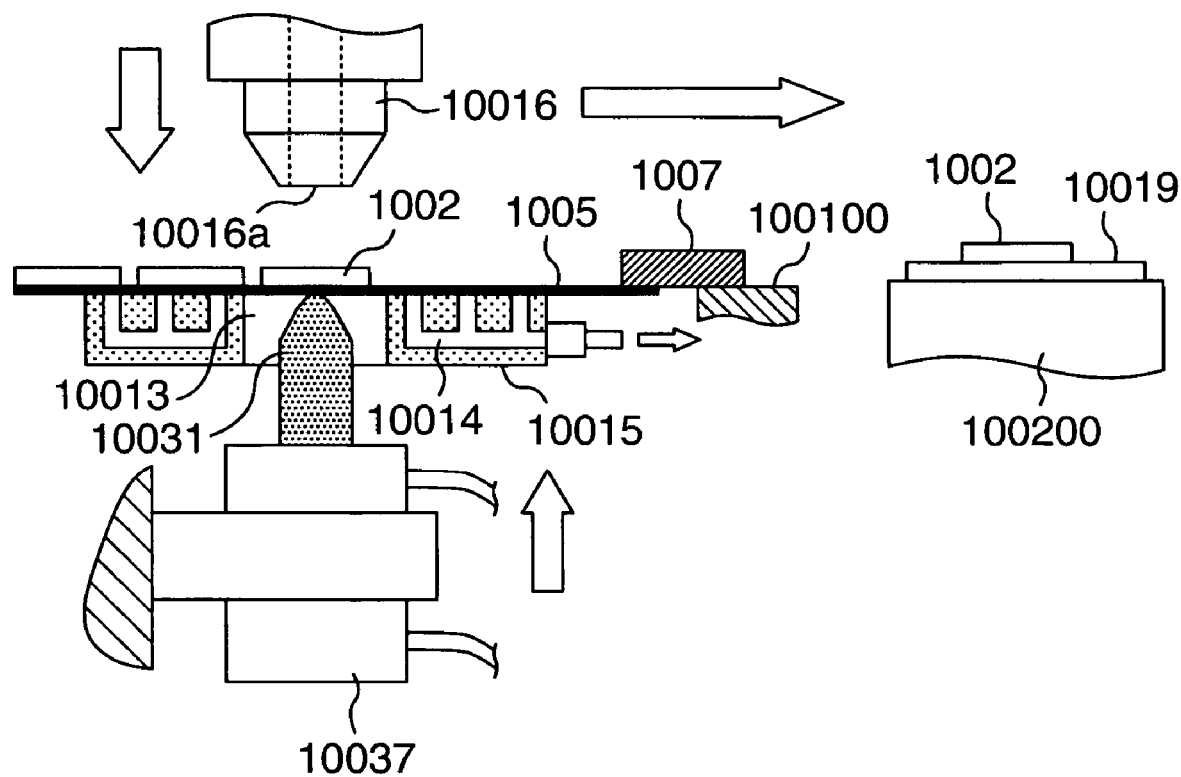
FIG. 25 is a sectional view showing a chip separating unit.

Then, a fabrication method of a semiconductor device, which is embodiment 8 of the present invention, is described below in detail. FIG. 25 is a sectional view showing a chip separating unit used for the fabrication method of the semiconductor device of this embodiment 8, and FIGS. 26(*a*) and 26(*b*) are sectional views showing an example of the upthrow operation of this embodiment 8 in order of the steps.

Similarly to the case of the above embodiment 6, the back of an adhesive sheet 1005 to which semiconductor chips 1002 are attached is vacuum-sucked through a vacuuming hole 10014 of a vacuuming stage 10015 to vacuum and hold the adhesive sheet 1005. In this case, a window hole 10013 has a size corresponding to one of the semiconductor chips 1002 to vacuum the portion of the adhesive sheet 1005 to which semiconductor chips 1002 other than that to be separated are attached. An upthrow pin 10031 for upthrowing the semiconductor chips 1002 is set below a vacuuming stage 10015 to perform vertical movement in accordance with motor driving and pneumatic driving.

In the case of this embodiment 8, a heater 10037 is set to the upthrow pin 10031 so that the tip end of the upthrow pin 10031 is controlled to be at a necessary temperature. In this case, the tip end of the upthrow pin 10031 is formed into a flat shape or circular-arc shape. According to this shape, the adhesive sheet 1005 is not easily broken when upheaving the upthrow pin 10031 and heat is easily propagated. The size and the circular arc at the tip end of the upthrow pin 10031 and the tip end angle are set in accordance with the characteristic of the adhesive sheet 1005 used.

The front-end temperature of the upthrow pin 10031 controlled by the heater 10037 is set at a temperature at which chips are not thermally broken or a temperature at which an adhesive sheet is expanded or contracted due to heat, for example, set at 50 to 80° C. The semiconductor chip 1002 to be separated is upheaved through the adhesive sheet 1005 by vacuuming the back of the sheet by the vacuuming stage 10015 and raising the upthrow pin 10031 when the tip end of the upthrow pin 10031 reaches a predetermined temperature while holding the adhesive sheet 1005. The upheaving value of the upthrow pin 10031 is set to 10 to 200 μm on the basis of the upside of the vacuuming stage 10015 so as not to break the adhesive sheet 1005. Thus, by heating the back of the adhesive sheet 1005 by the tip end of the upthrow pin 10031, the adhesive sheet 1005 is thermally deformed such that expansion or contraction and the semiconductor chips 1002 are easily removed. Moreover, the adhesive strength of the adhesive agent layer 1003 of the adhesive sheet 1005 is weakened through heating, and the semiconductor chips 1002 are easily removed. The front-end temperature of the upthrow pin 10031 is properly set in accordance with characteristics of the adhesive sheet 1005, such as the deformed value of a sheet base material 1004 due to heat and the adhesive strength of the adhesive agent layer 1003.

The semiconductor chips 1002 removed from the adhesive sheet 1005 are separated from the adhesive sheet 1005 by the vacuuming collet 10016 and mounted on a substrate 10019 on which a device will be mounted through bonding. In this case, it is allowed to set the timing for the vacuuming collet 10016 to vacuum-suck the semiconductor chips 1002 into the timing before or after upheaving the upthrow pin 10031.

Thus, by using a removal mechanism according to the upthrow operation of the upthrow pin 10031 whose tip end is heated, it is possible to obtain a semiconductor device having no scratch on the back of the semiconductor chip 1002 without breaking the adhesive sheet 1005. Moreover, just by setting the shape and aperture dimension of the tip end portion of the upthrow pin 10031 in accordance with the size of the semiconductor chip 1002, this can be applied to semiconductor chips 1002 of all sizes, from a large semiconductor chip 1002 up to a thin small semiconductor chip 1002.

For example, in the above description, the heating temperature of the tip end of the upthrow pin 10031 is described. However, it is possible to properly set the heating temperature in a range in which the semiconductor chip 1002 is not thermally broken or in accordance with the characteristic of the adhesive sheet 1005.

Moreover, while depending on the characteristic of the adhesive agent layer 1003 of the adhesive sheet 1005, it is allowed to separate the semiconductor chip 1002 by selectively cooling only the contact portion of the semiconductor chip 1002 to be removed on the adhesive sheet 1005 and lowering the adhesive strength.

Furthermore, in the case of the above mentioned one, the upthrow pin 10031 is heated so that the tip end of the pin 10031 reaches a predetermined temperature before upheaving the pin 10031. However, it is allowed to use a procedure for upheaving the upthrow pin 10031 and then heating the pin 10031 so that the tip end of the pin 10031 reaches a predetermined temperature inversely to the above mentioned case. However, the upthrow pin 10031 uses a material having a high heat conductivity so that the tip end of the pin 10031 is instantaneously heated.

Figure 27:
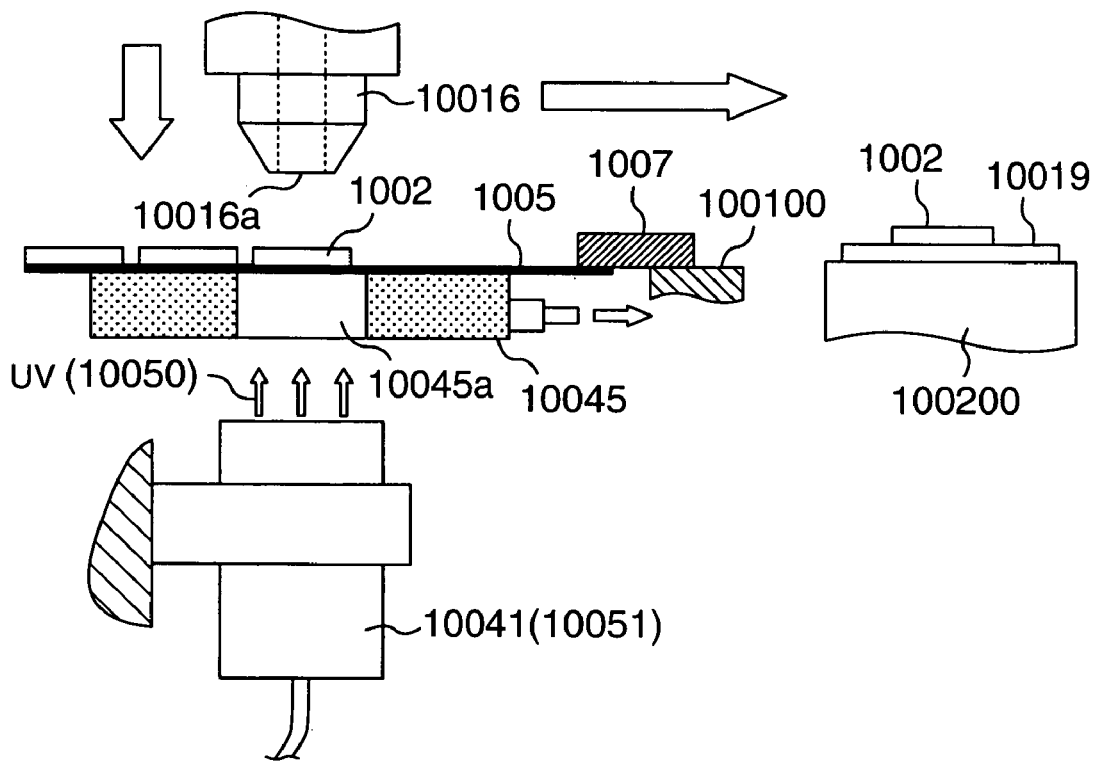
FIG. 27 is a sectional view showing a chip separating unit.

Then, a fabrication method of a semiconductor device, which is embodiment 9 of the present invention, is described below in detail. FIG. 27 is a sectional view showing a chip separating unit used for the fabrication method of the semiconductor device of this embodiment 9.

A pickup stage 100100 supporting a metallic frame 1007 and an adhesive sheet 1005 is moved and positioned so that a semiconductor chip 1002 to be separated reaches a predetermined position. A screening jig 10045 on which a window hole 10045*a* almost equal to a chip size is opened is set below the semiconductor chip 1002 to be separated so as to apply ultraviolet radiation UV from a UV applying unit 10041 at the bottom. According to this mechanism, only an adhesive agent layer 1003 of the adhesive sheet 1005 of the semiconductor chip 1002 to be separated is selectively cured so that the semiconductor chip 1002 is easily removed. Then, the semiconductor chip 1002 which is easily removed from the adhesive sheet 1005 is separated from the adhesive sheet 1005 by a vacuuming collet 10016 and mounted on a substrate 10019 on which a device will be mounted. In this case, it is allowed to set the timing for the vacuuming collet 10016 to vacuum the semiconductor chip 1002 to the timing before or after applying ultraviolet radiation UV to the adhesive sheet 1005.

By using an upthrow-pin-less removal mechanism for selectively applying ultraviolet radiation UV immediately before performing pickup and lowering the adhesive strength of the adhesive sheet 1005 without using an upthrow pin, it is possible to obtain a semiconductor device having no scratch on the back of the semiconductor chip 1002 without breaking the adhesive sheet 1005.

Moreover, by setting the aperture dimension of the window hole 10045*a* opened on the screening jig 10045 in accordance with the size of the single semiconductor chip 1002, this can be applied to removal of all semiconductor chips 1002, from a semiconductor chip of comparatively large size up to a thin and small semiconductor chip 1002.

However, when using this separation method, it is necessary to use the adhesive agent layer 1003 whose adhesive strength becomes almost zero by irradiating ultraviolet radiation UV as the adhesive agent layer 1003 on the adhesive sheet 1005 used and the adhesive sheet 1005.

Figure 28:
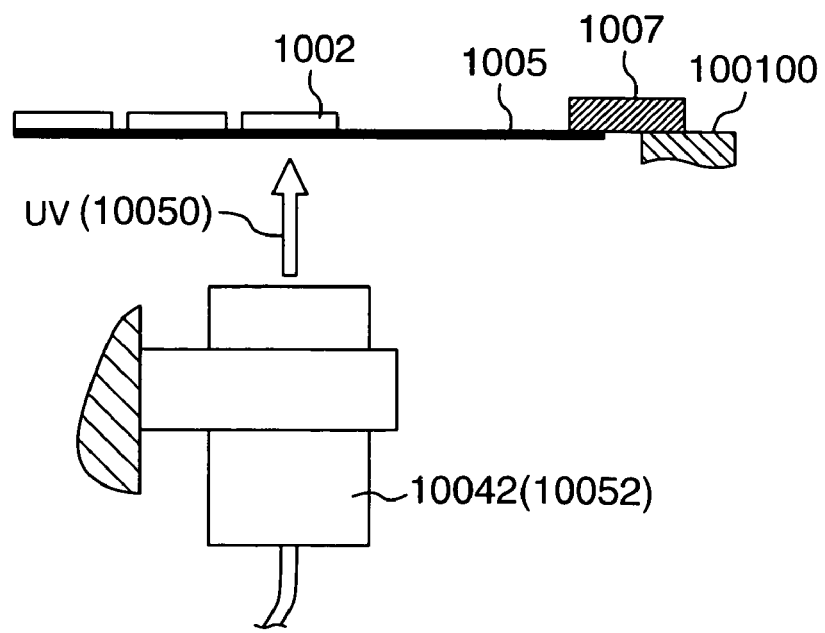
FIG. 28 is a sectional view showing a chip separating unit.

FIG. 28 is a sectional view showing a modification of this embodiment 9. In the above description, the screening jig 10045 on which the window hole 10045*a* having the same size as a chip is opened is set below the semiconductor chip 1002 to be separated to selectively apply ultraviolet radiation UV from the window hole 10045*a* at the bottom. However, by using a spot UV applying unit 10042 capable of applying the ultraviolet radiation UV converged like a spot, a method can be used which separates the semiconductor chip 1002 to be separated of the adhesive sheet 1005 by using a more simplified device configuration and selectively applying the ultraviolet radiation UV only to a contact portion of the semiconductor chip 1002 to be separated on the adhesive sheet 1005 and lowering the adhesive strength without using a component such as the screening jig 10045.

Moreover, it is allowed to use a method for accelerating removal by applying a laser beam 10050 only to a contact portion of the semiconductor chip 1002 to be separated on the adhesive sheet 1005 instead of ultraviolet radiation UV and selectively applying energy such as instantaneous heating.

In this case, as shown in FIG. 27, it is possible to use a method for selectively applying a broad laser beam 10050 only to a contact portion of the semiconductor chip 1002 to be separated on the from the window hole 10045*a* by using a laser beam source 10051 for emitting the laser beam 10050 and the screening jig 10045 together or as shown in FIG. 28, a method for selectively applying ultraviolet radiation UV only to a contact portion of the semiconductor chip 1002 to be separated by using a spot laser beam source 10052 for emitting a spot-like laser beam 10050 without using the screening jig 10045.

Moreover, it is allowed to use removal acceleration by the heating effect by applying a microwave only to a contact portion of the semiconductor chip 1002 to be separated on the adhesive sheet 1005 instead of ultraviolet radiation UV.

In the case of the fabrication method of the semiconductor device of this embodiment, the back of the semiconductor chip 1002 (semiconductor device) is not damaged at all in the pickup step as described above. Therefore, the reliability of the semiconductor chips 1002 is improved, the number of defective products due to damages of the semiconductor chips 1002 is greatly decreased, and the manufacturing yield of semiconductor devices is improved. Moreover, it is possible to quickly pick up semiconductor chips of all sizes, from a large semiconductor chip to a thin and small semiconductor chip, by using a chip separating unit having a simple configuration and contribute to reduction of the cost and improvement of the throughput in the fabrication process.

The invention made by the present inventor is specifically described in accordance with embodiments. However, the present invention is not restricted to the embodiments. It is needless to say that various modifications of the present invention are allowed as long as they are not deviated from the gist of the present invention.

What can be said for the embodiments in common is that it is possible to separate a diced semiconductor chip from an adhesive sheet in picking up the semiconductor chip without damaging the semiconductor chip independently of the size of the chip in the assembling process of a semiconductor device.

It is possible to provide a reliable semiconductor device having no scratch on the back of a thin and small semiconductor chip by separating the semiconductor chip from an adhesive sheet without breaking the adhesive sheet in the pickup step after dicing the semiconductor chip.

INDUSTRIAL APPLICABILITY

The present invention is an invention relating to the fabrication art in the semiconductor industry and an invention which can be used for industries.

The invention claimed is:

1. A method of manufacturing a semiconductor device including a pickup step of:
    after dicing a semiconductor wafer of a thickness of 100 µm or less, to which an adhesive sheet is attached, into individual semiconductor chips, vacuuming and holding each semiconductor chip using a vacuuming jig to collect each semiconductor chip from the adhesive sheet, wherein
    the pickup step further includes: using an upthrow jig so as to upheave the semiconductor device via the adhesive sheet while holding a portion of the adhesive sheet corresponding to a peripheral region of the semiconductor chip using a vacuuming stage; and imparting ultrasonic vibration, having been applied to the upthrow jig, to the semiconductor chip;
    imparting ultrasonic vibration, having been applied to the upthrow jig, to the semiconductor chip.

2. The method of manufacturing a semiconductor device according to claim 1, wherein
    said ultrasonic vibration is applied in a direction crossing an adhesive surface between the adhesive sheet and the semiconductor chips, or in a direction parallel with the adhesive surface.

3. The method of manufacturing a semiconductor device according to claim 1 further including
    providing a means for measuring the temperature of the semiconductor chips, the adhesive sheet, or a jig for applying the ultrasonic vibration to control the temperature thereof.

4. The method of manufacturing a semiconductor device according to claim 1, further including
    measuring and controlling the tension of the adhesive sheet.

5. The method of manufacturing a semiconductor device according to claim 1, further including providing a function in which the same separating operation is applied again to a chip of which separation from the adhesive sheet has failed once, but the same separating operation is not applied to the chip any more if the chip cannot be separated two times.

6. The method of manufacturing a semiconductor device according to claim 1, further including supplying the chip so that a circuit pattern surface thereof faces by reversing the semiconductor wafer upside down.

7. The method of manufacturing a semiconductor device according to claim 1 further including moving said contact jig for applying the ultrasonic vibration in a horizontal plane of the semiconductor chip while applying the ultrasonic vibration.

8. A method of manufacturing a semiconductor device including a pickup step of:

dicing a semiconductor wafer which has been subjected to back-grinding to have a thickness of 100 μm or less and to which an adhesive sheet is attached, into individual semiconductor chips;

vacuuming each semiconductor chip to hold it using a vacuuming jig to collect each semiconductor chip from the adhesive sheet;

applying ultrasonic vibration to the semiconductor chips through the adhesive sheet in the pickup step; and measuring the temperature of the semiconductor chips, the adhesive sheet, or a jig for applying the ultrasonic vibration to control the temperature thereof.

9. A method of manufacturing a semiconductor device including a pickup step of:

dicing a semiconductor wafer which has been subjected to back-grinding to have a thickness of 100 μm or less and to which an adhesive sheet is attached, into individual semiconductor chips;

vacuuming each semiconductor chip to hold it using a vacuuming jig to collect each semiconductor chip from the adhesive sheet;

applying ultrasonic vibration to the semiconductor chips through the adhesive sheet in the pickup step; and measuring and controlling the tension of the adhesive sheet.

10. A method of manufacturing a semiconductor device including a pickup step of:

dicing a semiconductor wafer which has been subjected to back-grinding to have a thickness of 100 μm or less and to which an adhesive sheet is attached, into individual semiconductor chips; and vacuuming each semiconductor chip to hold it using a vacuuming jig to collect each semiconductor chip from the adhesive sheet;

applying ultrasonic vibration to the semiconductor chips through the adhesive sheet in the pickup step; and providing a function in which the same separating operation is applied again to a chip of which separation from the adhesive sheet has failed once, but the same separating operation is not applied to the chip any more if the chip cannot be separated two times.

* * * * *